US009231149B2

(12) United States Patent
Kutzer et al.

(10) Patent No.: US 9,231,149 B2
(45) Date of Patent: Jan. 5, 2016

(54) PHOTOVOLTAIC CELL ELECTRODE AND METHOD FOR ELECTRICALLY CONNECTING A PHOTOVOLTAIC CELL

(75) Inventors: Martin Kutzer, Penig (DE); Olaf Storbeck, Dresden (DE); Harald Hahn, Dresden (DE); Holger Neuhaus, Freiberg (DE); Matthias Georgi, Dresden (DE)

(73) Assignee: SolarWorld Innovations GmbH, Freiberg (DE)

( * ) Notice: Subject to any disclaimer, the term of this patent is extended or adjusted under 35 U.S.C. 154(b) by 879 days.

(21) Appl. No.: 13/008,967

(22) Filed: Jan. 19, 2011

(65) Prior Publication Data

US 2011/0174354 A1    Jul. 21, 2011

(30) Foreign Application Priority Data

Jan. 19, 2010    (EP) .................................... 10151062

(51) Int. Cl.
  *H01L 31/00*    (2006.01)
  *H01L 31/18*    (2006.01)
  *H01L 31/05*    (2014.01)

(52) U.S. Cl.
  CPC .......... *H01L 31/188* (2013.01); *H01L 31/0508* (2013.01); *Y02E 10/50* (2013.01); *Y10T 29/49213* (2015.01)

(58) Field of Classification Search
  CPC ... H01L 31/188; H01L 31/0508; Y02E 10/50; Y10T 29/49213

USPC .......................................... 136/243, 244, 256
See application file for complete search history.

(56) References Cited

U.S. PATENT DOCUMENTS

| 6,121,542 A * | 9/2000 | Shiotsuka et al. ............ 136/256 |
| 2005/0241692 A1 * | 11/2005 | Rubin et al. ................. 136/256 |
| 2007/0144577 A1 | 6/2007 | Rubin et al. |
| 2007/0199588 A1 * | 8/2007 | Rubin et al. ................. 136/243 |
| 2009/0025788 A1 | 1/2009 | Rubin et al. |

FOREIGN PATENT DOCUMENTS

| DE | 10239845 C1 | 12/2003 |
| WO | 2007071064 A1 | 6/2007 |

OTHER PUBLICATIONS

European Search Report of European Patent Application No. 10 151 062.6 dated Jun. 9, 2010.

* cited by examiner

*Primary Examiner* — Matthew Martin

(57) ABSTRACT

An electrode for electrically connecting two photovoltaic cells is provided. Each photovoltaic cell may include a plurality of lamellar electrically conductive surface regions. The electrode may include a plurality of electrically conductive wires extending adjacent to one other; and a stabilizing structure coupled to the plurality of electrically conductive wires such that the space between the electrically conductive wires to one another is defined until the plurality of electrically conductive wires has been fixed on the plurality of lamellar electrically conductive surface regions of a photovoltaic cell.

13 Claims, 18 Drawing Sheets

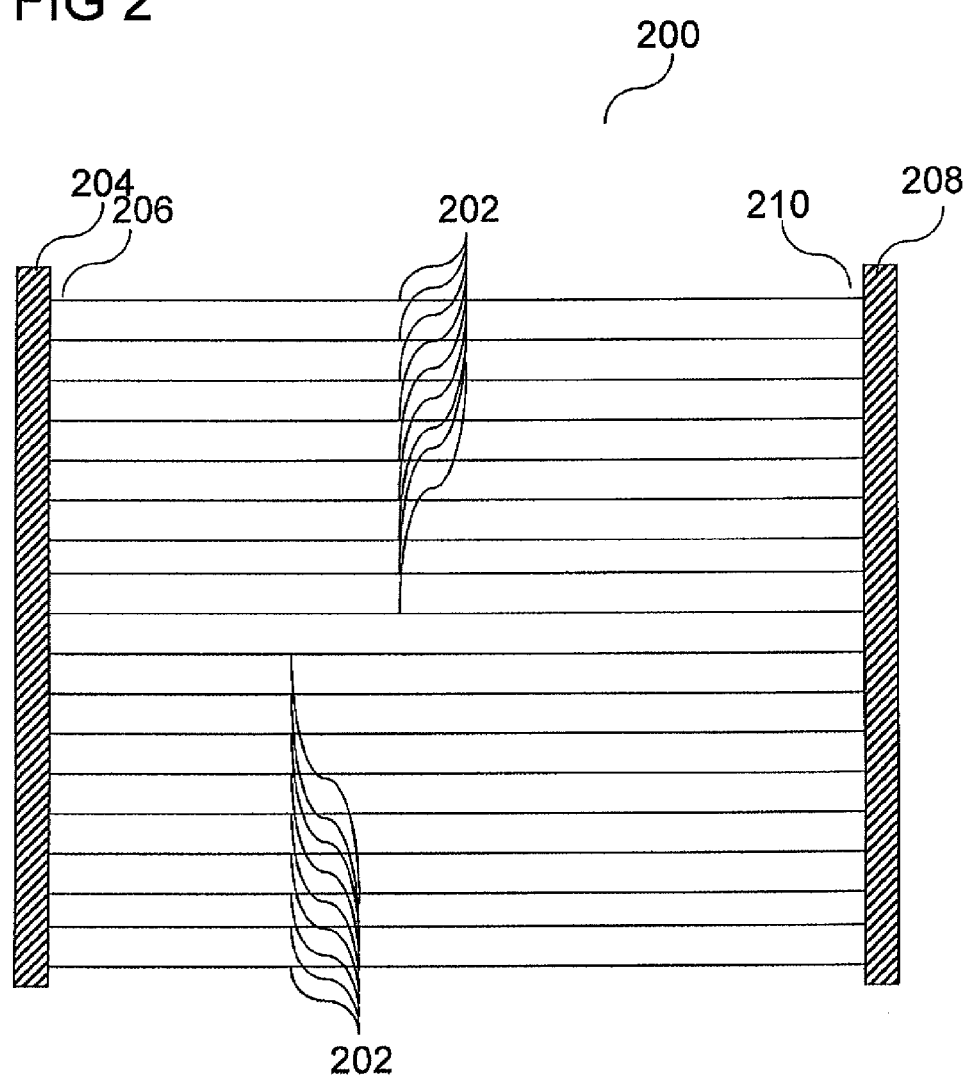

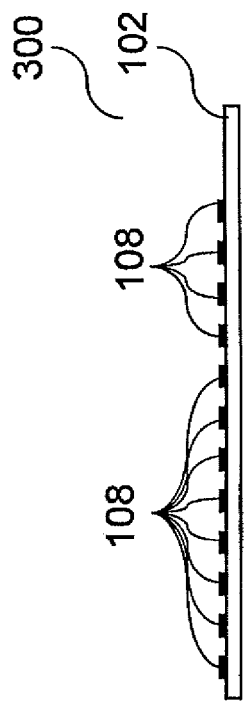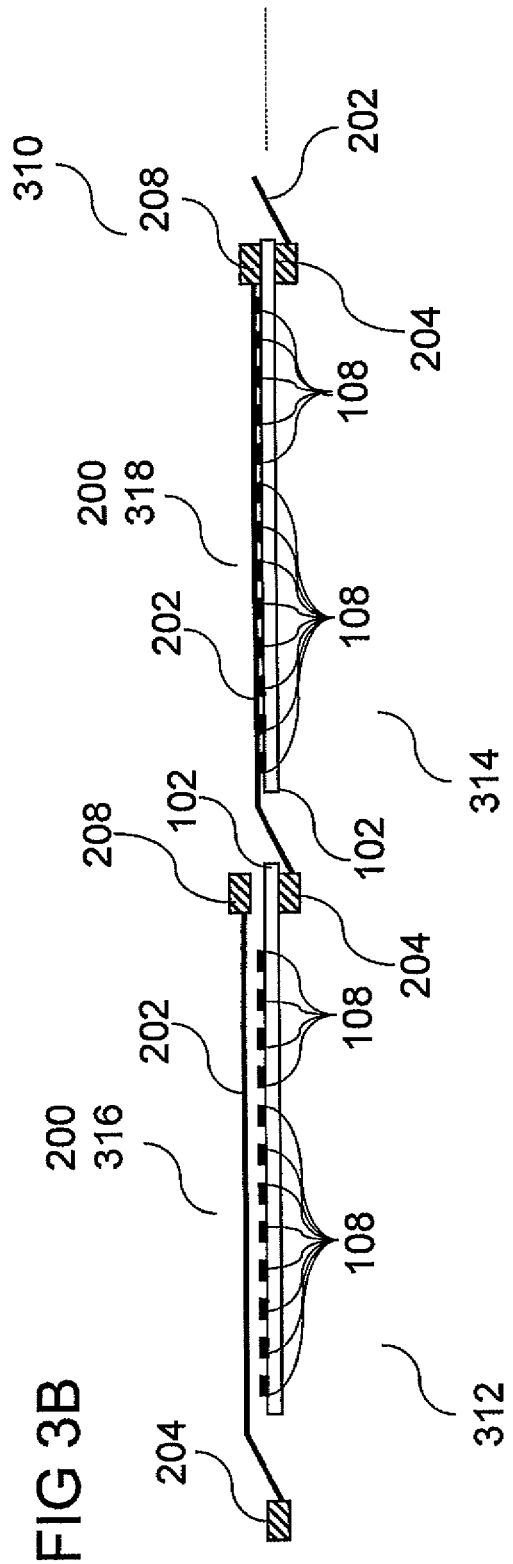

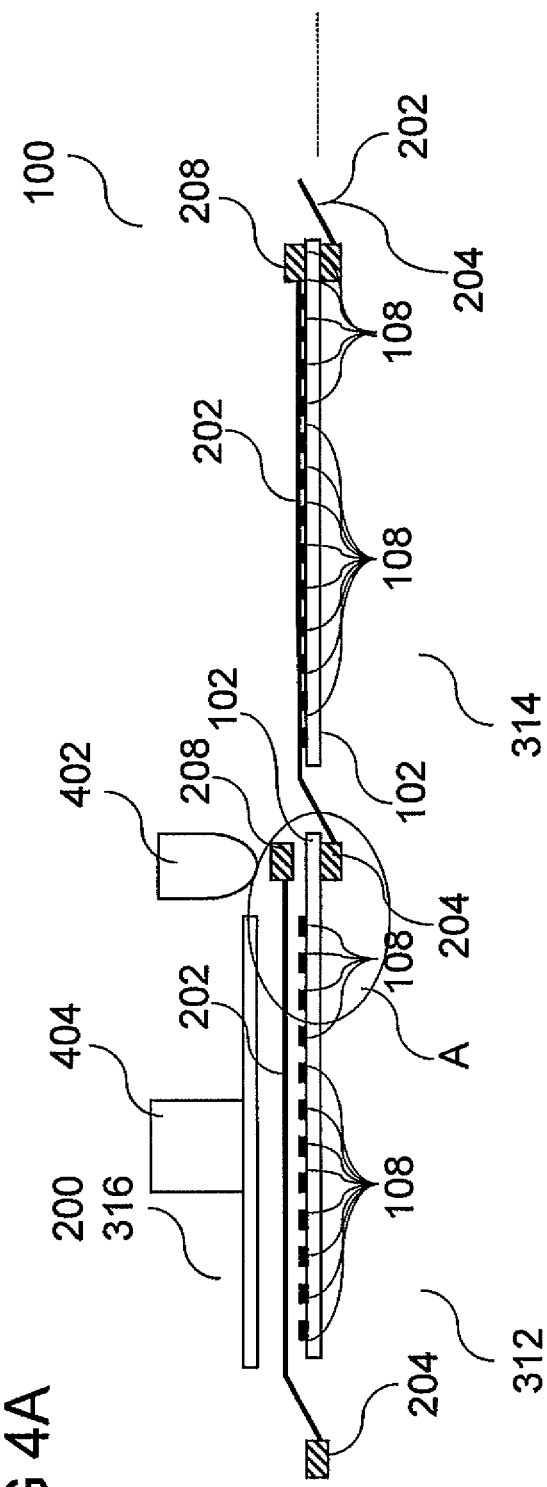
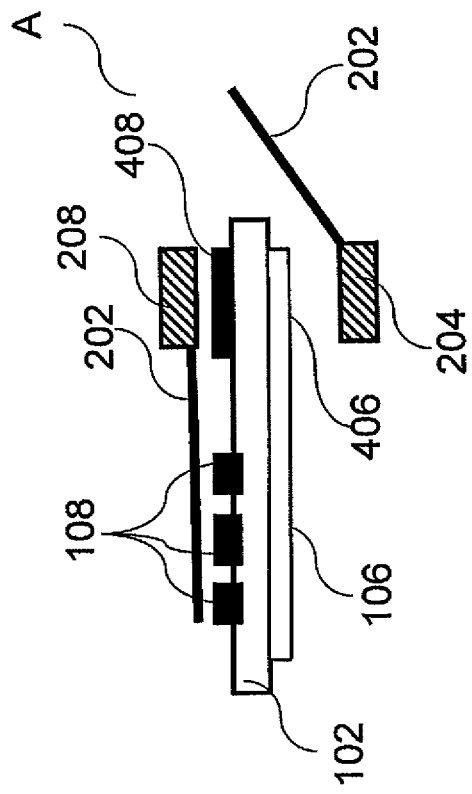

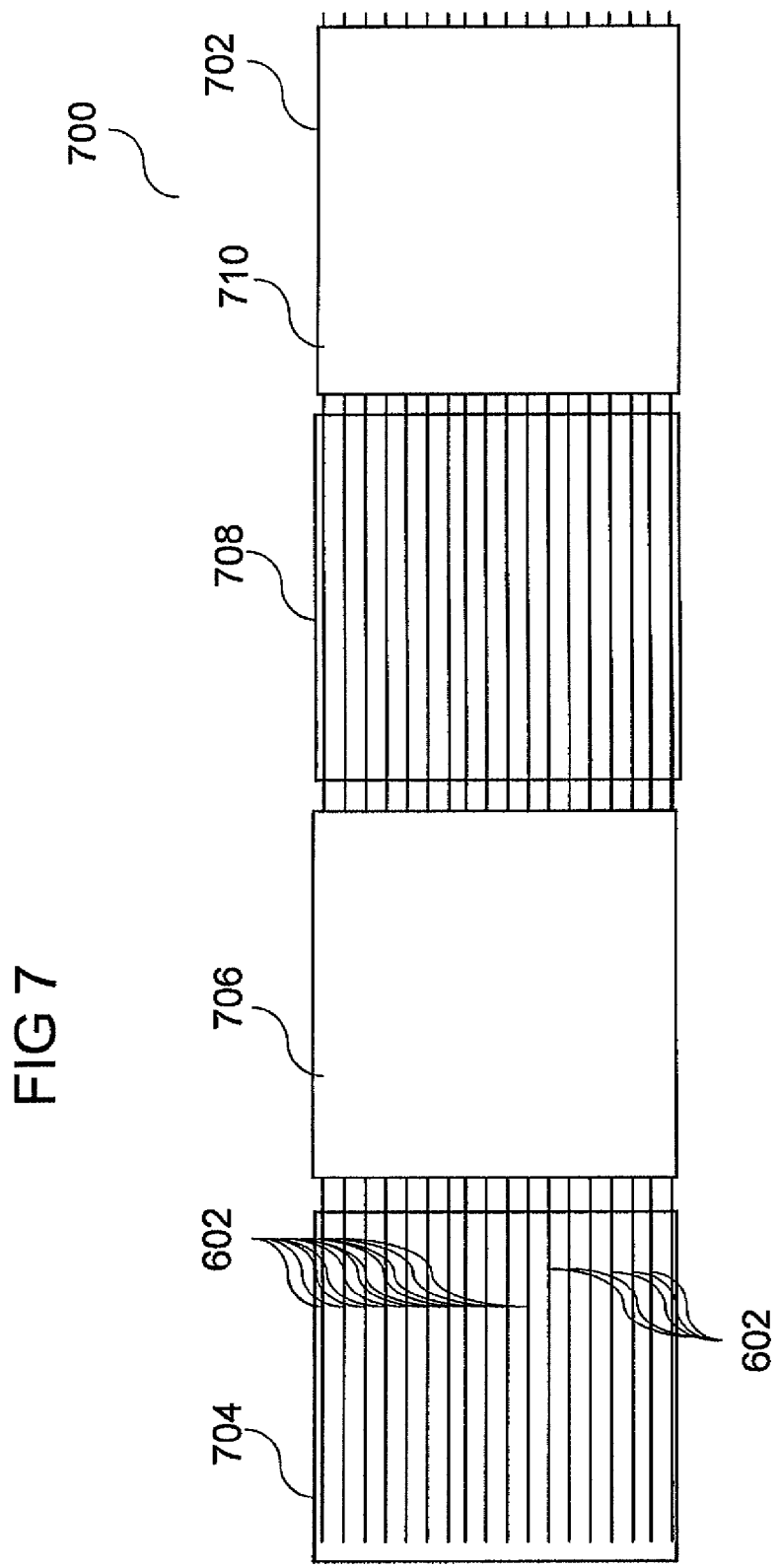

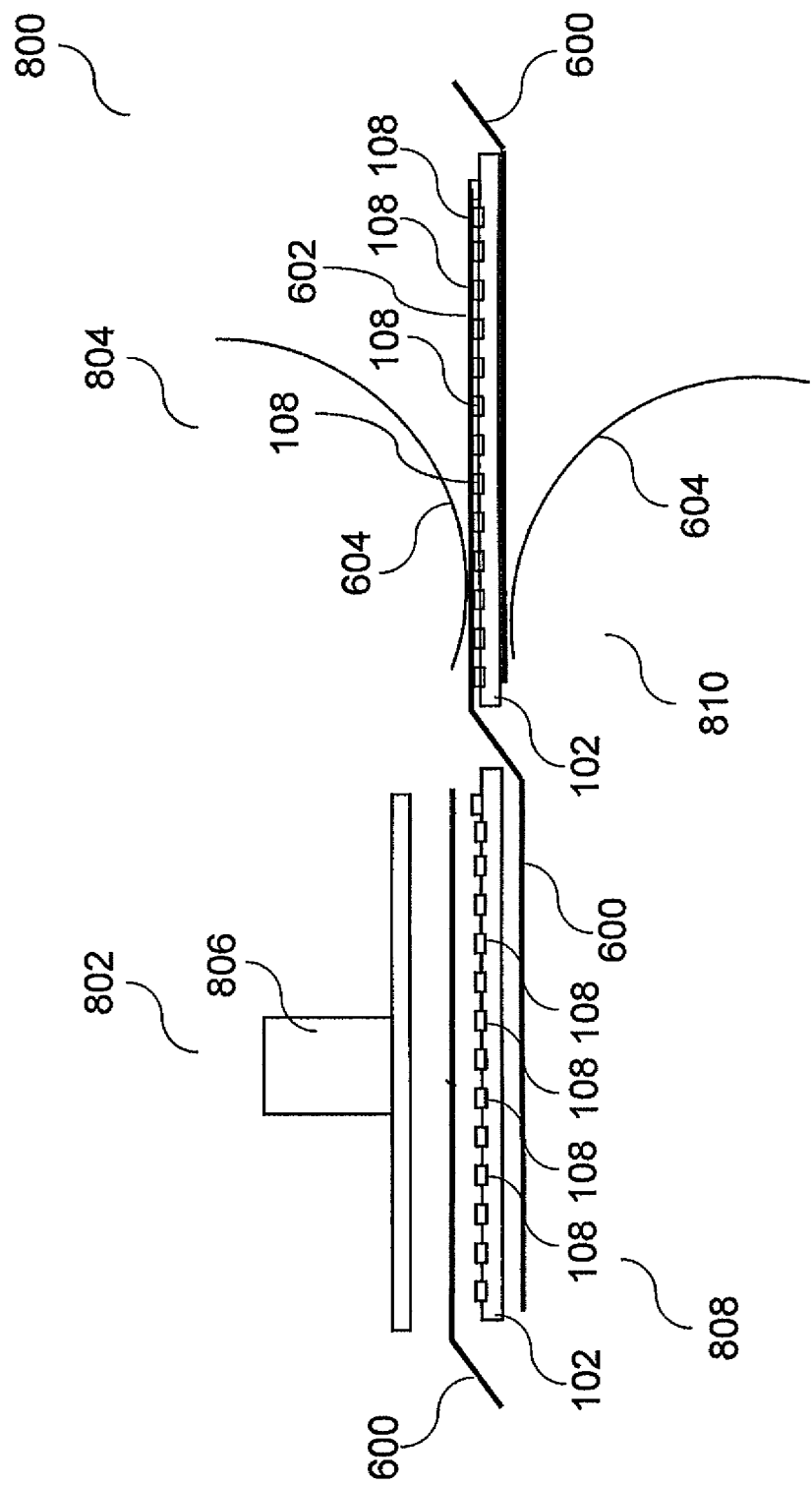

PHOTOVOLTAIC CELL ELECTRODE AND METHOD FOR ELECTRICALLY CONNECTING A PHOTOVOLTAIC CELL

CROSS-REFERENCE TO RELATED APPLICATION

This application claims priority to European Patent Application Serial No. 10151062.6, which was filed Jan. 19, 2010, and is incorporated herein by reference in its entirety.

TECHNICAL FIELD

Various embodiments relate to a photovoltaic cell electrode and a method for electrically connecting a photovoltaic cell.

BACKGROUND

A photovoltaic cell (e.g. a solar cell) usually includes a substrate having a front side and a rear side. Conventionally, a contact structure is provided on at least one of the both sides. Typically, the contact structure has a width of at least about 100 µm and a thickness in the range of only about 10 µm to about 15 µm. An increased width of the contact structure may result in a decrease of the efficiency due to the increased shadowing caused by this. Furthermore, a reduction of the width of the contact structure may result in an increased line resistance of the contact structure. Moreover, the electric current provided by the individual contact structures is usually collected by means of so-called busbars, which may cause additional shadowing of e.g. the front side surface of the substrate.

The electric connecting of photovoltaic cells is usually carried out by means of contact bands, which are soldered onto the busbars of the photovoltaic cell. In this case, the entire current is guided through the contact bands. In order to keep the resistance losses as low as possible, the contact bands require a certain total cross section area. This results in an increased shadowing of e.g. the front side surface of the substrate.

In order to achieve an improved photovoltaic module (e.g. solar module), the contact structure of the photovoltaic cell and the number and dimension of the contact bands may be combinatorial optimized.

In this case, it has been found out that a high number n (n usually greater than 30) of thin (e.g. having a diameter of less than 250 µm) electrically conductive wires may be useful. Furthermore, it is to be expected that due to a punctual fixation of the wires on the photovoltaic cell, less mechanical tensions may be caused due to different thermal expansion coefficients of the wires on the one hand and the photovoltaic cell on the other hand.

In practice, there is a need to easily and efficiently handle and position the thin wires on the photovoltaic cell.

DE 102 39 845 C1 discloses a method for positioning a plurality of wires on a photovoltaic cell, wherein the wires are fixed on an optically transparent film by means of an optically transparent adhesive. Then, the optically transparent film is fixed to the metallization of the solar cell. According to DE 102 39 845 C1, the optically transparent film as well as the optically transparent adhesive remain in the solar module which is formed by serial coupling of a plurality of such solar cells. This results in a rather high demand to the optically transparent film as well as the optically transparent adhesive with respect to their long-term stability. This causes rather high costs.

SUMMARY

An electrode for electrically connecting two photovoltaic cells is provided. Each photovoltaic cell may include a plurality of lamellar electrically conductive surface regions. The electrode may include a plurality of electrically conductive wires extending adjacent to one other; and a stabilizing structure coupled to the plurality of electrically conductive wires such that the space between the electrically conductive wires to one another is defined until the plurality of electrically conductive wires has been fixed on the plurality of lamellar electrically conductive surface regions of a photovoltaic cell.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a top view of a photovoltaic cell electrode in accordance with an embodiment;

FIG. 3A shows a side view of a photovoltaic cell with electric contact structures before the mounting of a photovoltaic cell electrode in accordance with an embodiment;

FIG. 3B shows a side view of two photovoltaic cells with electric contact structures in the process of mounting photovoltaic cell electrodes in accordance with an embodiment;

FIG. 4A shows a side view of two photovoltaic cells with electric contact structures in the process of mounting photovoltaic cell electrodes in accordance with an embodiment illustrating the fixing of the photovoltaic cell electrodes;

FIG. 4B shows an enlarged side view of a portion "A" of a photovoltaic cell and a photovoltaic cell electrode in accordance with an embodiment illustrating the fixing of the photovoltaic cell electrodes;

FIG. 7 shows a top view of a photovoltaic cell electrode in accordance with yet another embodiment;

FIG. 8 shows an enlarged side view of a photovoltaic cell and a photovoltaic cell electrode in accordance with an embodiment illustrating the fixing of the plurality of electrically conductive wires and the subsequent removing of at least a portion of a sheet structure;

DESCRIPTION

The following detailed description refers to the accompanying drawings that show, by way of illustration, specific details and embodiments in which the invention may be practiced.

As will be described in more detail below, various embodiments provide an electrode, e.g. a photovoltaic cell electrode (e.g. a solar cell electrode) for connecting photovoltaic cells in a photovoltaic cell module. In various embodiments, a photovoltaic cell may be understood as a device that converts light energy (in the case of a solar cell, e.g. of sunlight) directly into electricity by the photovoltaic effect.

In various embodiments, photovoltaic cells (e.g. solar cells), e.g. formed in or on a wafer, may be electrically connected and encapsulated as a photovoltaic module (e.g. a solar module). A photovoltaic module may have a sheet of glass on the front (light up, e.g. sun up) side, allowing light to pass while protecting the semiconductor wafers from the elements (rain, hail, etc.). In various embodiments, the photovoltaic cells (e.g. solar cells) are connected in series in photovoltaic modules, creating an additive voltage. Connecting photovoltaic cells (e.g. solar cells) in parallel may yield a higher current. Photovoltaic modules (e.g. solar modules) then may be interconnected, in series or parallel, or both, to create an array with the desired peak DC voltage and current.

Furthermore, various embodiments provide a photovoltaic cell (e.g. solar cell) having the corresponding optional metallization for being fixed to a photovoltaic cell electrode in accordance with an embodiment, and a photovoltaic module (e.g. solar module), which includes a plurality or multiplicity of electrically connected (in serial and/or in parallel) photovoltaic cells (e.g. solar cells), which may be connected with each other by means of one or more photovoltaic cell electrode(s) in accordance with an embodiment.

Figure 1A:
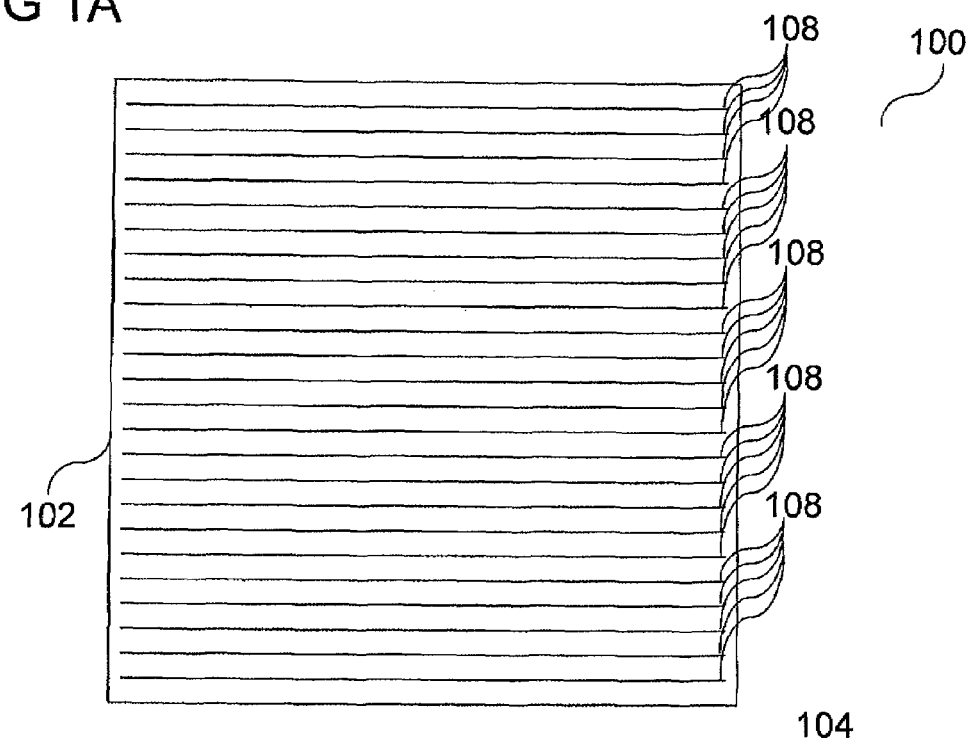
FIG. 1A shows a front view of a photovoltaic cell with electric contact structures before the mounting of a photovoltaic cell electrode in accordance with an embodiment.

FIG. 1A shows a front view of a photovoltaic cell 100 with electric contact structures before the mounting of a photovoltaic cell electrode in accordance with an embodiment. In various embodiments, the photovoltaic cell 100 may include a substrate. Furthermore, the substrate may include or consist of at least one photovoltaic layer 102. As an alternative, at least one photovoltaic layer 102 may be disposed on or over the substrate. The at least one photovoltaic layer 102 may include or consist of semiconductor material (such as e.g. silicon), a compound semiconductor material (such as e.g. a III-V compound semiconductor material (such as e.g. GaAs), a II-VI semiconductor material (such as e.g. CdTe), or a I-III-V compound semiconductor material (such as e.g. copper indium disulfide)). As an alternative, the at least one photovoltaic layer 102 may include or consist of an organic material. In various embodiments, the silicon may include or consist of single-crystalline silicon, poly-crystalline silicon, amorphous silicon, and/or microcrystalline silicon. The at least one photovoltaic layer 102 may include a semiconductor junction structure such as e.g. a pn-junction structure, a pin-junction structure, a Schottky type junction structure, and the like. A light-transparent electrically conductive layer may optionally be disposed on or over the at least one photovoltaic layer. The light-transparent electrically conductive layer may include, for example, a thin film including indium-tin-oxide or tin-oxide (which may be formed by means of sputtering, for example). The light-transparent electrically conductive layer may be configured as an anti-reflection coating.

Figure 1B:
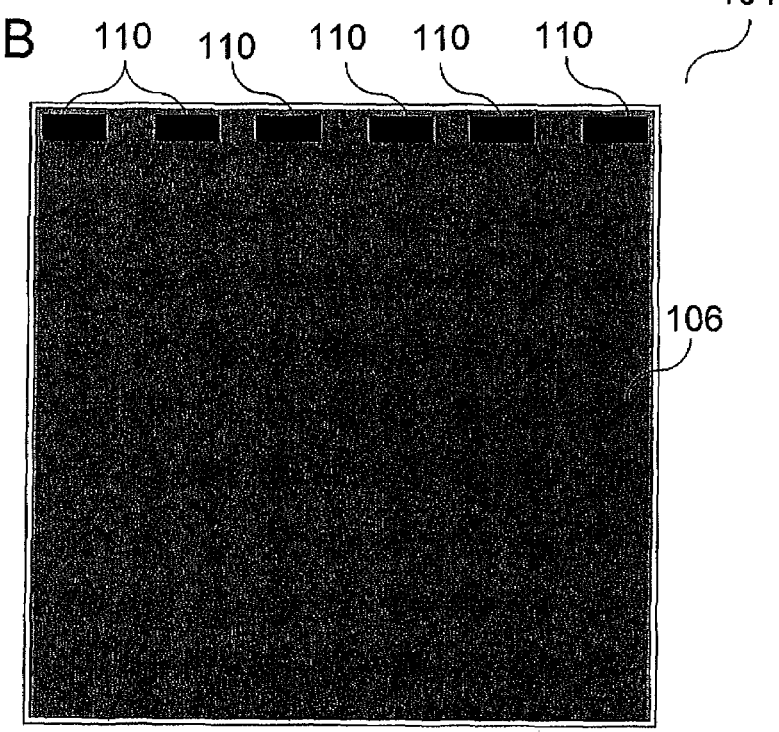
FIG. 1B shows a rear view of a photovoltaic cell with electric contact structures before the mounting of a photovoltaic cell electrode in accordance with an embodiment.

The rear side 104 of the photovoltaic cell FIG. 1A is shown in FIG. 1B. On the rear side, a rear electrode 106 may be provided covering a portion of or the entire bottom surface of the substrate. The rear electrode 106 may include or consist of electrically conductive material, e.g. a metal such as e.g. one or more of the following metals: Cu, Al, Au, Pt, Ag, Pb, Sn, Fe, Ni, Co, Zn, Ti, Mo, W, and/or Bi. The rear electrode 106 may be optically transparant. In various embodiments, the rear electrode 106 may be patterned.

Referring again back to FIG. 1A, an electric contact structure, e.g. implemented in the form of a plurality of metallization lines 108, may be provided on or over the front surface (in other words, exposed surface) of the at least one photovoltaic layer 102 or, if present, on or over the exposed surface of the light-transparent electrically conductive layer. The metallization lines 108 may extend substantially in parallel to each other at a distance from each other. However, it should be noted that the metallization lines 108 may alternatively extend with an angle to each other, but they usually do not cross or contact each other along their extensions. In various embodiments, the metallization lines 108 may be provided in a comb form having a plurality of metal fingers extending in parallel to each other. The metallization lines 108 are one implementation of lamellar electrically conductive surface regions being provided in accordance with various embodiments. Any other suitable lamellar electrically conductive surface structure may be provided in an alternative embodiment.

As an option one or a plurality of contact regions (which may also be referred to as contact pads, not shown) may be provided on the front (sun up) side 100 of the photovoltaic cell 100. The contact regions may be made of electrically conductive material such as e.g. a metal, e.g. Ag, Ni, Cu or Al. As will be described in more detail below, an electrically conductive band of an electrode in accordance with an embodiment may be fixed (e.g. soldered) to the contact regions. As will be described in more detail also below, in an alternative embodiment, the contact regions may be omitted.

Furthermore, as an option one or a plurality of rear contact regions 110 (which may also be referred to as rear contact pads) may be provided on the rear side 104 of the photovoltaic cell 100. The rear contact regions 110 may be made of electrically conductive material such as e.g. a metal, e.g. Ag, Ni, Cu or Al. As will be described in more detail below, an electrically conductive band of an electrode in accordance with an embodiment may be fixed (e.g. soldered) to the rear contact regions 110. As will be described in more detail also below, in an alternative embodiment, the rear contact regions 110 may be omitted.

Furthermore, as will be described in more detail also below, in various embodiments, the conventionally provided busbars running perpendicular to the metallization lines 108 may be omitted. In other words, various embodiments provide a photovoltaic cell or a photovoltaic module being busbar-free.

In various embodiments, the photovoltaic cell may have the following dimensions: a width in the range from about 10 cm to about 50 cm, a length in the range from about 10 cm to about 50 cm, and a thickness in the range from about 100 µm to about 500 µm, e.g. a thickness in the range from about 200 µm to about 300 µm.

FIG. 2 shows a top view of a photovoltaic cell electrode 200 in accordance with an embodiment. In various embodiments, the photovoltaic cell electrode 200 may include a plurality of electrically conductive wires 202 extending adjacent to one other. However, it should be noted that the electrically conductive wires 202 may alternatively extend with an angle to each other, but they usually do not cross or contact each other along their extensions. In various embodiments, the arrangement (including the distance between the electrically conductive wires 202) of the electrically conductive wires 202 may be pre-determined such that the shadowing caused by the electrically conductive wires 202 is as small as possible. The electrically conductive wires 202 may be thin electrically conductive wires 202. The thickness of the electrically conductive wires 202 may differ from wire to wire or all electrically conductive wires 202 may have the same thickness. In various embodiments, the electrically conductive wires 202 may have a thickness (in the case in which the electrically conductive wires 202 have a circular form) in the range from about 20 µm to about 300 µm, e.g. in the range from about 50 µm to about 250 µm. In various embodiments, the photovoltaic cell electrode 200 may include about 3 to about 150 electrically conductive wires 202, e.g. about 30 to about 70 electrically conductive wires 202. Furthermore, in various embodiments, the shape and/or dimensions of the electrically conductive wires 202 may differ from wire to wire or all electrically conductive wires 202 may have the same shape and/or dimension.

The electrically conductive wires 202 may be configured to collect and transmit electric power generated by the at least one photovoltaic layer 102. The electrically conductive wires 202 may include or consist of electrically conductive material, e.g. metallically conductive material. In various embodiments, the electrically conductive wires 202 may include or consist of a metallic material, which may include or consist of one or more of the following metals: Cu, Al, Au, Pt, Ag, Pb, Sn, Fe, Ni, Co, Zn, Ti, Mo, W, and/or Bi. In various embodiments, the electrically conductive wires 202 may include or consist of a metal selected from a group consisting of: Cu, Au, Ag, Pb, and Sn.

The electrically conductive wires 202 may in general have an arbitrary cross-section such as e.g. a round form, an oval form, a circular form, a triangle form, a rectangular (e.g. square) form, or any other polygonal form.

The electrically conductive wires 202 may be coated (partially or fully circumferentially) with solder material such as e.g. a solder layer, which allows the soldering of the electrically conductive wires 202 to the surface of the photovoltaic cell, e.g. to the metallization lines 108.

In various embodiments, the photovoltaic cell electrode 200 may include at least four electrically conductive wires 202. In various embodiments, the photovoltaic cell electrode 200 may include at least twenty electrically conductive wires 202.

In various embodiments, some or all of the electrically conductive wires 202 of the plurality of electrically conductive wires 202 have a wire width of 0.5 mm or less, e.g. a wire width of 0.1 mm or less.

In various embodiments, the photovoltaic cell electrode 200 may include a stabilizing structure 204, 208 coupled to each of the plurality of electrically conductive wires such that the space (in other words relative arrangement) of the plurality of electrically conductive wires to each other is defined for mounting the plurality of electrically conductive wires on the plurality of lamellar electrically conductive surface regions of the photovoltaic cell. In various embodiments, the photovoltaic cell electrode 200 may include a stabilizing structure 204, 208 coupled to each of the plurality of electrically conductive wires such that the space between (in other words relative arrangement of) the plurality of electrically conductive wires to each other is defined until the plurality of electrically conductive wires 202 has been fixed on the plurality of lamellar electrically conductive surface regions of the photovoltaic cell.

In various embodiments, the stabilizing structure may be flexible so that the electrode including the stabilizing structure and the plurality of electrically conductive wires may be bent (when positioning the electrode on the plurality of lamellar electrically conductive surface regions of the photovoltaic cell, the electrode may be spanned over the respective surface of the photovoltaic cell), e.g. in a direction perpendicular to the plane formed by the plurality of electrically conductive wires when the electrode is spanned.

As shown in FIG. 2, in various embodiments, the stabilizing structure 204, 208 may include a frame structure coupled to each of the plurality of electrically conductive wires 202, e.g. at or near the end regions 206, 210 of the plurality of electrically conductive wires 202. By way of example, the frame structure may include a first frame portion 204 coupled (e.g. fixed) to a first end region 206 of each of the plurality of electrically conductive wires 202 and a second frame portion 208 coupled (e.g. fixed) to a second end region 210 of each of the plurality of electrically conductive wires 202. In various embodiments, the first frame portion 204 may include a first ribbon 204 (or a first band 204 made of an electrically conductive material, e.g. a first metal band 204) and/or the second frame portion 208 may include a second ribbon 208 (or a second band 208 made of an electrically conductive material, e.g. a second metal band 208). In various embodiments, the first frame portion 204 and/or the second frame portion 208 include/includes a wire meshwork.

As shown in FIG. 2, the first (e.g. elongated) frame portion 204 and the second (e.g. elongated) frame portion 208 extend substantially perpendicular to the electrically conductive wires 202. The fixing may be implemented e.g. by means of pressing, e.g. thermocompression, soldering, welding, or adhesive bonding, and the like. In various embodiments, the fixing of the electrically conductive wires 202 to the frame structure, e.g. to the frame portions 204, 208 is mechanically stable with respect to the process in which the electrically conductive wires 202 are fixed to the exposed surface of the photovoltaic cell, e.g. to the metallization lines 108. In various embodiments, the fixed coupling of the electrically conductive wires 202 to the frame structure, e.g. to the frame portions 204, 208 is mechanically stable with respect to the soldering process in which the electrically conductive wires 202 are soldered to the metallization lines 108.

The first frame portion 204 and/or the second frame portion 208 may have different shapes. By way of example, the first frame portion 204 and/or the second frame portion 208 may be implemented as rods with respective recesses or openings to receive the respective end portions of the electrically conductive wires 202.

It is to be noted that it is not necessary that there is an electrical contact between the respective electrically conductive wires 202 and the first frame portion 204 and the second frame portion 208, respectively in addition to the provided mechanical coupling. The current provided by the electrically conductive wires 202 may alternatively be collected and transmitted by another line, which may additionally be provided.

Moreover, in various embodiments, the frame structure, e.g. the first (e.g. elongated) frame portion 204 and the second (e.g. elongated) frame portion 208 may by patterned on the sun up side of the photovoltaic cell, thereby reducing the shadowing caused by the frame structure.

In various embodiments, the first (e.g. elongated) frame portion 204 and the second (e.g. elongated) frame portion 208 may have different dimensions. By way of example, the first band 204 may have a different width than the second band 208. In various embodiments, the first (e.g. elongated) frame portion 204 and the second (e.g. elongated) frame portion 208 are similar. In various embodiments, the frame portion being mounted on the sun up side of the photovoltaic cell (e.g. in FIG. 3B, the second frame portion 208) is narrower, i.e. may have a smaller width than the other frame portion, which may be mounted on the rear side of the photovoltaic cell (e.g. in FIG. 3B, the first frame portion 204). By doing this, the shadowed active cell area of the photovoltaic cell may be reduced in accordance with various embodiments.

In various embodiments, the first (e.g. elongated) frame portion 204 may have the following dimensions:
 a width in the range from about 1 mm to about 500 mm, e.g. a width in the range from about 1 mm to about 500 mm;
 a length in the range from about 100 mm to about 500 mm, e.g. a length in the range from about 125 mm to about 210 mm; and
 a thickness in the range from about 100 µm to about 500 µm, e.g. a thickness in the range from about 100 µm to about 350 µm.

In various embodiments, the second (e.g. elongated) frame portion 208 may have the following dimensions:
 a width in the range from about 1 mm to about 5 mm, e.g. a width in the range from about 1 mm to about 2 mm;
 a length in the range from about 100 mm to about 500 mm, e.g. a length in the range from about 125 mm to about 210 mm; and
 a thickness in the range from about 100 µm to about 500 µm, e.g. a thickness in the range from about 100 µm to about 350 µm.

In various embodiments, the photovoltaic cell electrode 200 as shown in FIG. 2 provides that the electrically conductive wires 202 are fixed at their both ends (with the frame portions 204, 208). The frame portions 204, 208 have a rather large width, which allows an easy realization of its handling, transport and positioning on or above the photovoltaic cell(s).

FIG. 3A shows a side view 300 of the photovoltaic cell 100 of FIGS. 1A and 1B with the electric contact structures 108 before the mounting of the photovoltaic cell electrode 200 in accordance with an embodiment. Furthermore, FIG. 3B shows a side view 310 of two photovoltaic cells (a first photovoltaic cell 312 and a second photovoltaic cell 314) with respective electric contact structures 108 in the process of mounting photovoltaic cell electrodes 200 (e.g. a first photovoltaic cell electrode 316 to be mounted on the first photovoltaic cell 100, 312, and a second photovoltaic cell electrode 318 to be mounted on the second photovoltaic cell 100, 314) in accordance with an embodiment. The photovoltaic cell electrodes 316, 318 are similar to the photovoltaic cell electrode 200 as shown in FIG. 2 and as described above.

In order to provide a serial connection of the photovoltaic cells 316, 318, . . . , to provide a photovoltaic module, in various embodiments, the first photovoltaic cell electrode 316 may be positioned over the first photovoltaic cell 312 such that the second frame portion 208 (e.g. the second metal band 208) is located above and subsequently on e.g. the contact regions optionally provided on the sun up side of the first photovoltaic cell 312 in an edge region thereof. The second frame portion 208 (e.g. the second metal band 208) may be soldered to the contact regions (in this embodiment, the contact regions may be or include solder pads). The soldering of the second frame portion 208 (e.g. the second metal band 208) to the contact regions is symbolized in the left portion of FIG. 4A by means of reference numeral 402.

In an alternative embodiment, in which no contact regions are provided, the second frame portion 208 (e.g. the second metal band 208) of the first photovoltaic cell electrode 316 may be located above and subsequently on the sun up side of the first photovoltaic cell 312 in an edge region thereof and may be directly coupled (e.g. by means of adhesive bonding) to the light-transparent electrically conductive layer which may be configured as an anti-reflection coating. Also in this case, an electrical contact between the second frame portion 208 (e.g. the second metal band 208) and the photovoltaic cell (e.g. the first photovoltaic cell 312) is not necessary.

Then, as also shown in FIG. 4A, the electrically conductive wires 202 are fixed, e.g. soldered, to the metallization lines 108 (in general, to the lamellar electrically conductive surface regions) of the photovoltaic cell. The soldering of the electrically conductive wires 202 to the metallization lines 108 is symbolized in the left portion of FIG. 4A by means of reference numeral 404. It is to be noted that the first photovoltaic cell electrode 316 and the second photovoltaic cell electrode 318 are positioned on the sun up side of the photovoltaic cells 312, 314 such that the electrically conductive wires 202 cross the metallization lines 108 (in general, to the lamellar electrically conductive surface regions) of the photovoltaic cells 312, 314. In various embodiments, the first photovoltaic cell electrode 316 and the second photovoltaic cell electrode 318 are positioned on the sun up side of the photovoltaic cells 312, 314 such that the electrically conductive wires 202 run substantially perpendicular to the metallization lines 108 (in general, to the lamellar electrically conductive surface regions) of the photovoltaic cells 312, 314. After having brought the electrically conductive wires 202 in physical contact with the metallization lines 108, the electrically conductive wires 202 may be soldered to the metallization lines 108 (in general, to the lamellar electrically conductive surface regions) (e.g. at their crossing regions).

As shown in FIG. 4B, in various embodiments, various photovoltaic cell concepts provide a rear side metallization (e.g. made of aluminum or copper) of the photovoltaic cells. In other words, in various embodiments, the photovoltaic cell 100 includes a rear electrode 106 as rear side metallization. In various embodiments, the first frame portion 204 (e.g. the first metal band 204) of the second photovoltaic cell electrode 318 may be coupled to the rear electrode 106 of the first photovoltaic cell 312. In various embodiments, the first frame portion 204 (e.g. the first metal band 204) of the second photovoltaic cell electrode 318 may be adhered to the rear electrode 106 of the first photovoltaic cell 312, e.g. by means of an electrically conductive adhesive. In various embodiments, the rear electrode 106 of the first photovoltaic cell 312 is in electrical contact with a rear contact 406. FIG. 4B also shows a contact region (which may also be referred to as contact pads) provided on the front (sun up) side of the photovoltaic cell.

In an alternative embodiment, one or more rear contacting regions 110, e.g. one or more rear solder pads 110, 406 may be provided on the rear side of a respective photovoltaic cell 312, 314. The one or more rear contacting regions 110, 406, e.g. one or more rear solder pads 110, 406 may be part of the rear electrode 106 or may be separate elements, which may be electrically coupled to the rear electrode 106. In this alternative embodiment, the first frame portion 204 (e.g. the first metal band 204) of the second photovoltaic cell electrode 318 may be soldered to the one or more rear solder pads 110, 406 of the rear side of the first photovoltaic cell 312. Thus, in this case, the first frame portion 204 (e.g. the first metal band 204) of the second photovoltaic cell electrode 318 is fixed to the rear electrode 106 of the first photovoltaic cell 312 by means of soldering.

In various embodiments, due to the photovoltaic cell electrode 200 and the metallization concept, the shadowing of the active cell area may substantially be reduced. The current which is generated in the photovoltaic cell may have a shorter way to pass through the thin metallization lines 108 of the photovoltaic cell before it enters the low resistance electrically conductive wires 202 and then to be provided at an output of the photovoltaic cell and/or at an output of the photovoltaic module having a plurality of electrically connected photovoltaic cells. Thus, the ohmic losses may be reduced. Furthermore, it is made possible to design the metallization lines 108, e.g. the fingers of the metallization comb, even thinner, thereby further reducing the shadowing of the active cell area of the photovoltaic cell.

Figure 5:
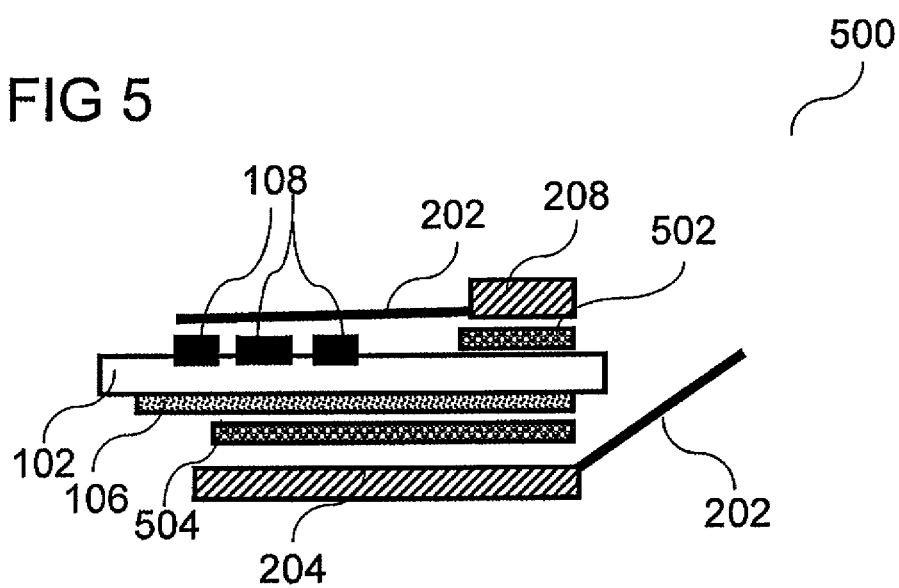
FIG. 5 shows an enlarged side view of a portion of a photovoltaic cell and a photovoltaic cell electrode in accordance with another embodiment illustrating the fixing of the photovoltaic cell electrodes.

FIG. 5 shows an enlarged side view 500 of a portion of a photovoltaic cell and a photovoltaic cell electrode in accordance with another embodiment illustrating the fixing of the photovoltaic cell electrodes. This embodiment is similar to the embodiment shown in FIGS. 4A and 4B. Therefore, only the differences between these embodiments will be described in more detail below. In the embodiment shown in FIG. 5, the photovoltaic cells do not include separate contacting regions, e.g. no soldering pads. In this embodiment, a first adhesive, e.g. a first electrically conductive adhesive 502 is provided on the sun up side of the photovoltaic cell in an edge region thereof. The second frame portion 208 (e.g. the second metal band 208) of the first photovoltaic cell electrode 316 may thus be adhered (by means of the first electrically condutive adhesive 502) to the light-transparent electrically conductive layer (if present) which may be configured as an anti-reflection coating. It is to be noted that in various embodiments, the first adhesive 502 does not need to be electrically conductive. Thus, a simple and thus inexpensive adhesive may be used as the first adhesive 502, since the first adhesive 502 only serves for the mechanical fixing of the second frame portion 208 on the sun up side of the photovoltaic cell.

Furthermore, in this embodiment, a second electrically condutive adhesive 504 is provided on the rear side of the photovoltaic cell in an edge region (or in any other desired region; the second electrically condutive adhesive 504 may also be disposed on most of or the entire rear electrode 106). The first frame portion 204 (e.g. the first metal band 204) of the second photovoltaic cell electrode 318 may thus be adhered (by means of the second electrically condutive adhesive 504) to the rear electrode 106 of the first photovoltaic cell electrode 316. As shown in FIG. 5, in various embodiments, the first frame portion 204 (e.g. the first metal band 204) (in general, the frame portion to be fixed to the rear side of the respective photovoltaic cell) may have a greater width than the second frame portion 208 (e.g. the second metal band 208) (in general, the frame portion to be fixed to the sun up side of the respective photovoltaic cell). In various embodiments, the first frame portion 204 (e.g. the first metal band 204) (in general, the frame portion to be fixed to the rear side of the respective photovoltaic cell) may be designed such that it covers the entire rear electrode 106 and/or the entire rear side of the respective photovoltaic cell.

Figure 6A:
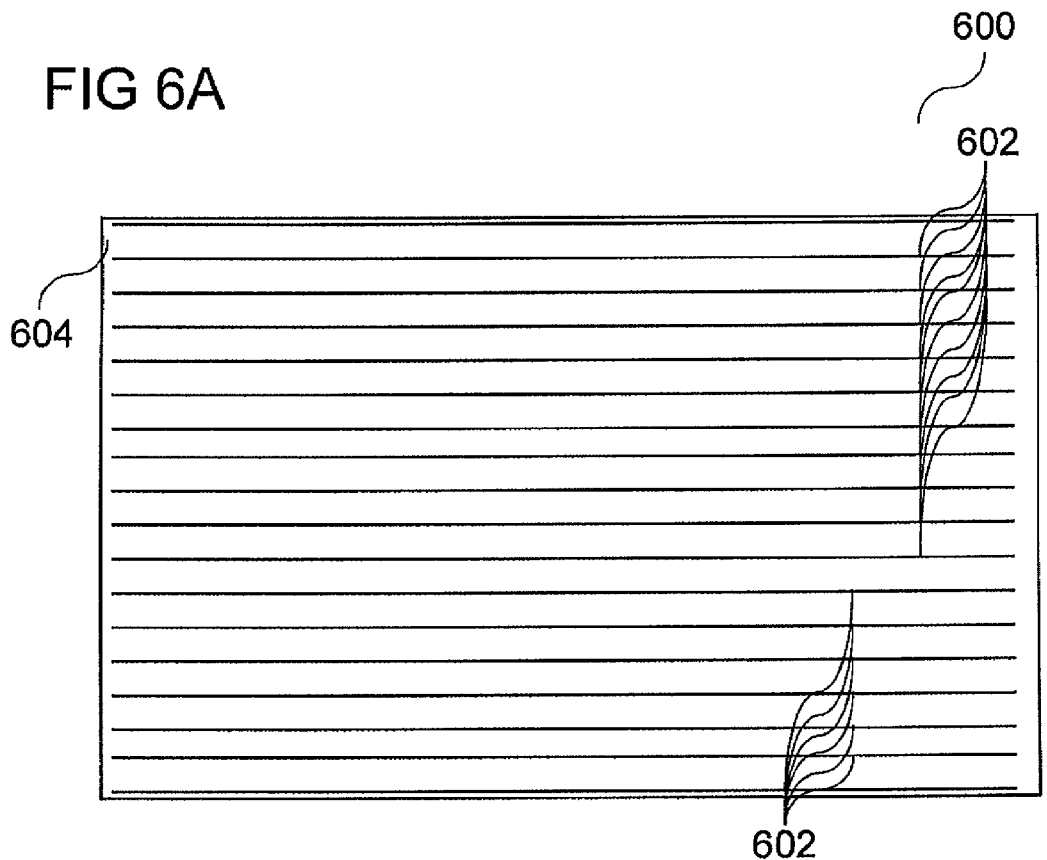
FIG. 6A shows a top view of a photovoltaic cell electrode in accordance with another embodiment.
Figure 6B:
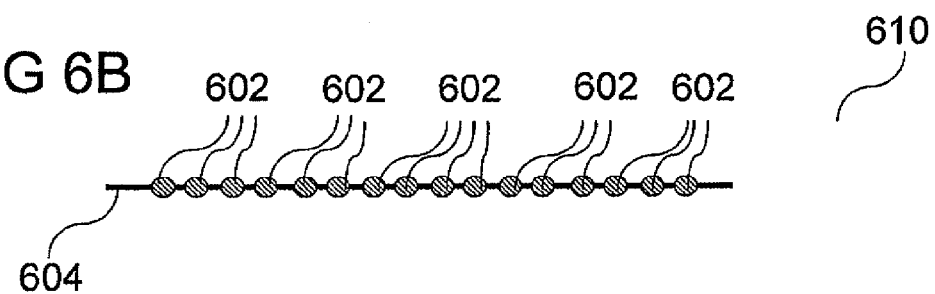
FIG. 6B shows a cross sectional view of the photovoltaic cell electrode shown in FIG. 6A.

FIG. 6A shows a top view of a photovoltaic cell electrode 600 in accordance with another embodiment and FIG. 6B shows a cross sectional view 610 of the photovoltaic cell electrode 600 shown in FIG. 6A.

In various embodiments, the photovoltaic cell electrode 600 may include a plurality of electrically conductive wires 602 extending adjacent to one other. However, it should be noted that the electrically conductive wires 602 may alternatively extend with an angle to each other, but they usually do not cross or contact each other along its extension. In various embodiments, the arrangement (including the distance between the electrically conductive wires 602) of the electrically conductive wires 602 may be pre-determined such that the shadowing caused by the electrically conductive wires 602 is as small as possible. The electrically conductive wires 602 may be thin electrically conductive wires 602. The thickness of the electrically conductive wires 602 may differ from wire to wire or all electrically conductive wires 602 may have the same thickness. In various embodiments, the electrically conductive wires 602 may have a thickness (in the case in which the electrically conductive wires 602 have a circular form) in the range from about 20 μm to about 300 μm, e.g. in the range from about 50 μm to about 250 μm. In various embodiments, the photovoltaic cell electrode 600 may include about 3 to about 150 electrically conductive wires 602, e.g. about 30 to about 70 electrically conductive wires 602.

The electrically conductive wires 602 may be configured to collect and transmit electric power generated by the at least one photovoltaic layer. The electrically conductive wires 602 may include or consist of electrically conductive material, e.g. metallically conductive material. In various embodiments, the electrically conductive wires 602 may include or consist of a metallic material, which may include or consist of one or more of the following metals: Cu, Al, Au, Pt, Ag, Pb, Sn, Fe, Ni, Co, Zn, Ti, Mo, W, and/or Bi. In various embodiments, the electrically conductive wires 602 may include or consist of a metal selected from a group consisting of: Cu, Au, Ag, Pb, and Sn.

The electrically conductive wires 602 may in general have an arbitrary cross-section such as e.g. a round form, an oval form, a circular form, a triangle form, a rectangular (e.g. square) form, or any other polygonal form.

The electrically conductive wires 602 may be coated (partially or fully circumferential) with solder material such as e.g. a solder layer, which allows the soldering of the electrically conductive wires 602 to the surface of the photovoltaic cell, e.g. to the metallization lines 108.

In various embodiments, the photovoltaic cell electrode 600 may include a stabilizing structure 604 coupled to each of the plurality of electrically conductive wires such that the space between (in other words relative arrangement of) the plurality of electrically conductive wires to each other is defined until the plurality of electrically conductive wires 202 has been fixed on the plurality of lamellar electrically conductive surface regions of the photovoltaic cell.

As shown in FIGS. 6A and 6B, in various embodiments, the stabilizing structure 604 may include a sheet structure 604 carrying the plurality of electrically conductive wires 602, wherein the sheet structure 604 is (e.g. removably) coupled to the plurality of electrically conductive wires 602 such that it can be at least partially removed from the plurality of electrically conductive wires 602 after the plurality of electrically conductive wires 602 has been fixed to the plurality of lamellar electrically conductive surface regions of the photovoltaic cell.

In various embodiments, the sheet structure 604 may include one or more of the following structures: a meshwork structure; a knitted fabrics structure; a patterned sheet structure; and/or a non-patterned film sheet structure.

In various embodiments, the sheet structure 604 may include a paper structure, e.g. a siliconized paper. In various embodiments, the sheet structure 604 may include or consist of a plastic film. In various embodiments, the sheet structure 604 may include or consist of polymeric plastic film.

The electrically conductive wires 602 may be adhered onto the sheet structure 604. In this case, the adhesive may be selected such that the sheet structure 604 can be at least partially removed from the plurality of electrically conductive wires 602 after the plurality of electrically conductive wires 602 has been fixed to the photovoltaic cell. In another embodiment, the electrically conductive wires 602 may be formed into the sheet structure 604. In this embodiment, the sheet structure 604 may e.g. be removed from the electrically conductive wires 602 after the fixing of the electrically conductive wires 602 to the photovoltaic cell e.g. by means of etching or by ashing the sheet structure 604 followed by a washing process step. In various embodiments, the adhesive for bonding the electrically conductive wires 602 to the sheet structure 604 is selected such that the sheet structure 604 may be easily removed from the electrically conductive wires 602 after the soldering of the electrically conductive wires 602 to the metallization lines 108 without destroying the sheet structure 604. In various embodiments, adhesive elastomeres could be used as the adhesive, such as e.g. polyurethane, ethylene-copolymeres or styrol-block-copolymeres, such as e.g. styrol-isoprene-styrol (SIS), styrol-ethylene-butylene-styrol (SEBS), styrol-ethylene-propylene-styrol (SEPS), styrol-butadiene-styrol (SBS), copolymeres or mixtures of the mentioned copolymeres. In various embodiments, the electrically conductive wires 602 may laterally project the sheet structure 604 at one or both of its ends.

In various embodiments, the sheet structure 604 may be designed as a flexible structure, which may be bent, if desired. In various embodiments, the sheet structure 604 may have a thickness in the range from about 20 μm to about 250 μm, e.g. a thickness in the range from about 50 μm to about 120 μm.

FIG. 7 shows a top view of a photovoltaic cell electrode 700 in accordance with yet another embodiment.

In various embodiments, the sheet structure may also be provided as a sheet band 702, onto which the electrically conductive wires 602 may be disposed or into which the electrically conductive wires 602 may be formed. The electrically conductive wires 602 may be similar to those as described with reference to FIGS. 6A and 6B.

In various embodiments, the sheet band 702 may be cut into sheet pieces of appropriate size before its use. In various embodiments, in case the electrically conductive wires 602 are e.g. adhered to the sheet structure, it may be provided that the adhesion is provided from alternating sides of the electrically conductive wires 602, as shown in FIG. 7, in which a first sheet portion 704 is coupled (e.g. adhered) to one side (a first side) of the electrically conductive wires 602 (the electrically conductive wires 602 are visible in this region in FIG. 7), a second sheet portion 706 is coupled (e.g. adhered) to the opposite side (a second side) of the electrically conductive wires 602 (the electrically conductive wires 602 are not visible in this region in FIG. 7), a third sheet portion 708 is coupled (e.g. adhered) again to the first side of the electrically conductive wires 602, a fourth sheet portion 710 is coupled (e.g. adhered) again to the first side of the electrically conductive wires 602, and so on. In other words, in various embodiments, an alternating bonding may be provided such that alternatingly the first side (e.g. top side) of the electrically conductive wires 602 and the second side (e.g. the rear side) of the electrically conductive wires 602 are bonded with the sheet structure.

Furthermore, the electrically conductive wires 602 may then be bonded to the photovoltaic cell, e.g. to the metallization lines 108, e.g. by means of soldering.

After the bonding of the electrically conductive wires 602 to the photovoltaic cell, e.g. to the metallization lines 108, at least a portion of the sheet structure, e.g. the entire sheet structure may be removed from the electrically conductive wires 602. Thus, the sheet structure will not become part of the finally completed photovoltaic cell and the finally completed and shipped photovoltaic module.

This is shown in FIG. 8, which illustrates the fixing of the plurality of electrically conductive wires and the subsequent removing of at least a portion of a sheet structure in a process diagram 800.

As illustrated in FIG. 8, in a first process stage 802, the electrically conductive wires 202 are fixed, e.g. soldered, to the metallization lines 108 of the photovoltaic cell. The soldering of the electrically conductive wires 202 to the metallization lines 108 is symbolized in the left portion of FIG. 8 by means of reference numeral 806. It is to be noted that the photovoltaic cell electrodes 600 are positioned on the sun up side of the photovoltaic cells 808, 810 such that the electrically conductive wires 602 cross the metallization lines 108 of the photovoltaic cells 808, 810. In various embodiments, the photovoltaic cell electrodes 600 are positioned on the sun up side of the photovoltaic cells 808, 810 such that the electrically conductive wires 602 run substantially perpendicular to the metallization lines 108 of the photovoltaic cells 808, 810. After having brought the electrically conductive wires 602 in physical contact with the metallization lines 108, the electrically conductive wires 602 may be soldered to the metallization lines 108 (e.g. at their crossing regions).

Then, in a second process stage 804, the sheet structure 604 may be removed, e.g. stripped, from the electrically conductive wires 602 which have been soldered to the metallization lines 108.

Figure 9:
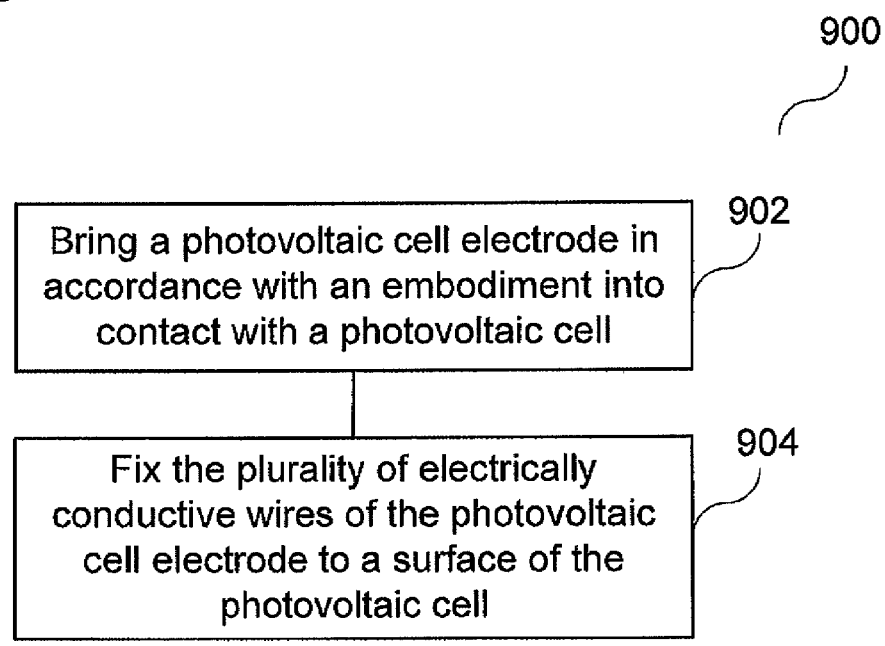
FIG. 9 shows a flow diagram illustrating a method for electrically contacting a photovoltaic cell in accordance with an embodiment.

FIG. 9 shows a flow diagram illustrating a method 900 for electrically contacting a photovoltaic cell in accordance with an embodiment. The method 900 may include, at 902, bringing a photovoltaic cell electrode in accordance with an embodiment as previously described, into contact with the photovoltaic cell, and, at 904, fixing the plurality of electrically conductive wires of the photovoltaic cell electrode to a surface of the photovoltaic cell. The fixing may include soldering the plurality of electrically conductive wires of the photovoltaic cell electrode to the plurality of lamellar electrically conductive surface regions of the photovoltaic cell.

Furthermore, in various embodiments, the method may further include cutting the plurality of electrically conductive wires near one edge of the photovoltaic cell.

Furthermore, in various embodiments, the method may further include removing at least a portion of the stabilizing structure after having fixed the plurality of electrically conductive wires of the photovoltaic cell electrode to the surface of the photovoltaic cell, e.g. after having fixed the plurality of electrically conductive wires to the lamellar electrically conductive regions.

Figure 10:
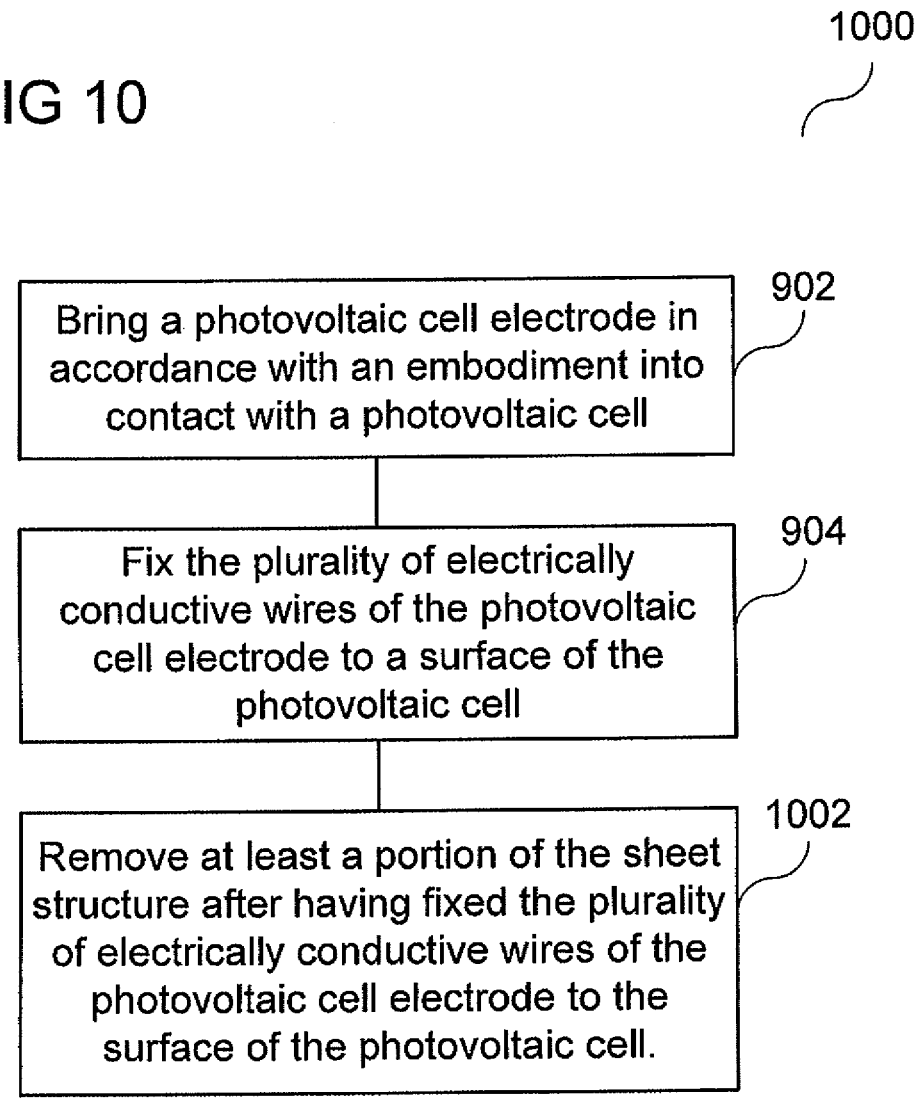
FIG. 10 shows a flow diagram illustrating a method for electrically contacting a photovoltaic cell in accordance with another embodiment.

FIG. 10 shows a flow diagram illustrating a method 1000 for electrically contacting a photovoltaic cell in accordance with another embodiment. The method 1000 includes the process of the method 900 shown in FIG. 9 and described above and furthermore may include the process 1002 of removing at least a portion of the sheet structure after having fixed the plurality of electrically conductive wires of the photovoltaic cell electrode to the surface of the photovoltaic cell.

Figure 11:
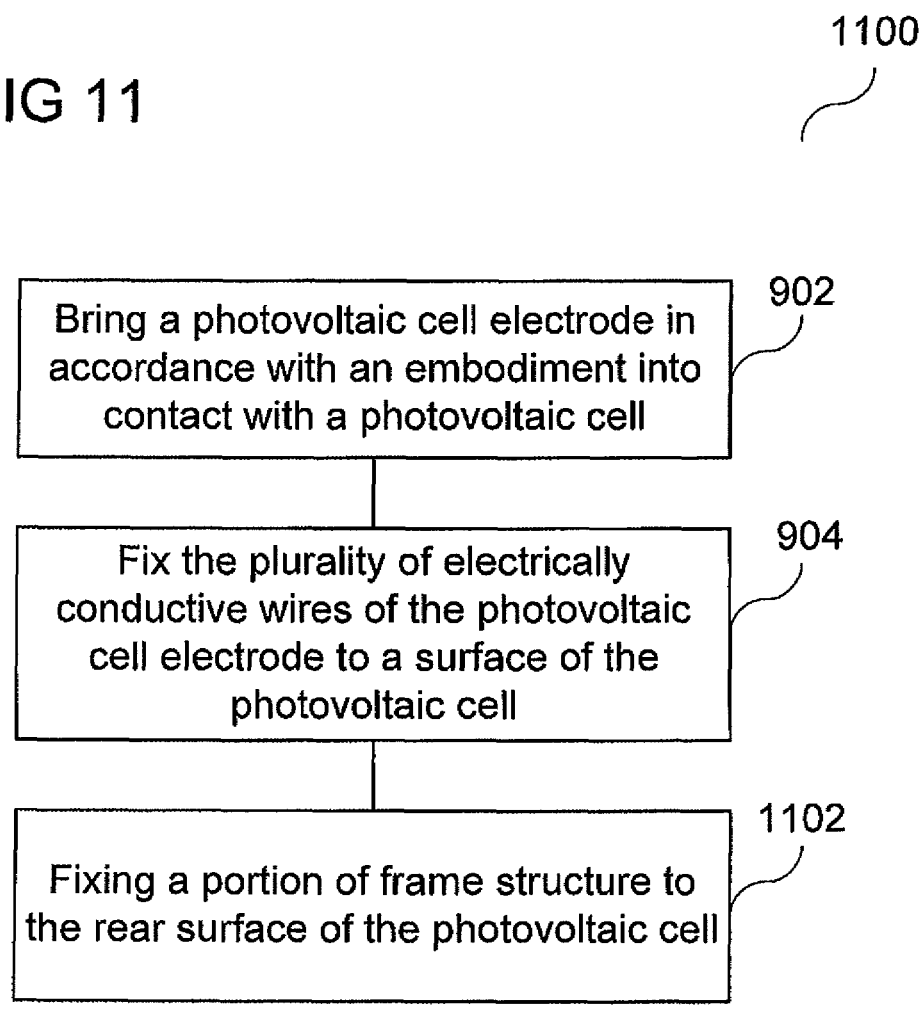
FIG. 11 shows a flow diagram illustrating a method for electrically contacting a photovoltaic cell in accordance with yet another embodiment.

FIG. 11 shows a flow diagram illustrating a method 1100 for electrically contacting a photovoltaic cell in accordance with yet another embodiment. The method 1100 includes the process of the method 900 shown in FIG. 9 and described above and furthermore may include the process 1102 of fixing a portion of a frame structure to the rear surface of the photovoltaic cell. In various embodiments, the method may include mechanically fixing a first portion of the coupling structure to the surface of the photovoltaic cell and mechanically coupling a second portion of the coupling structure to a surface of a further photovoltaic cell.

In various embodiments, in which the stabilizing structure includes a frame structure coupled to each of the plurality of electrically conductive wires near the end regions of the plurality of electrically conductive wires, the method may further include removing at least a frame portion after having fixed the plurality of electrically conductive wires of the photovoltaic cell electrode to the surface of the photovoltaic cell 1002.

Figure 12A:
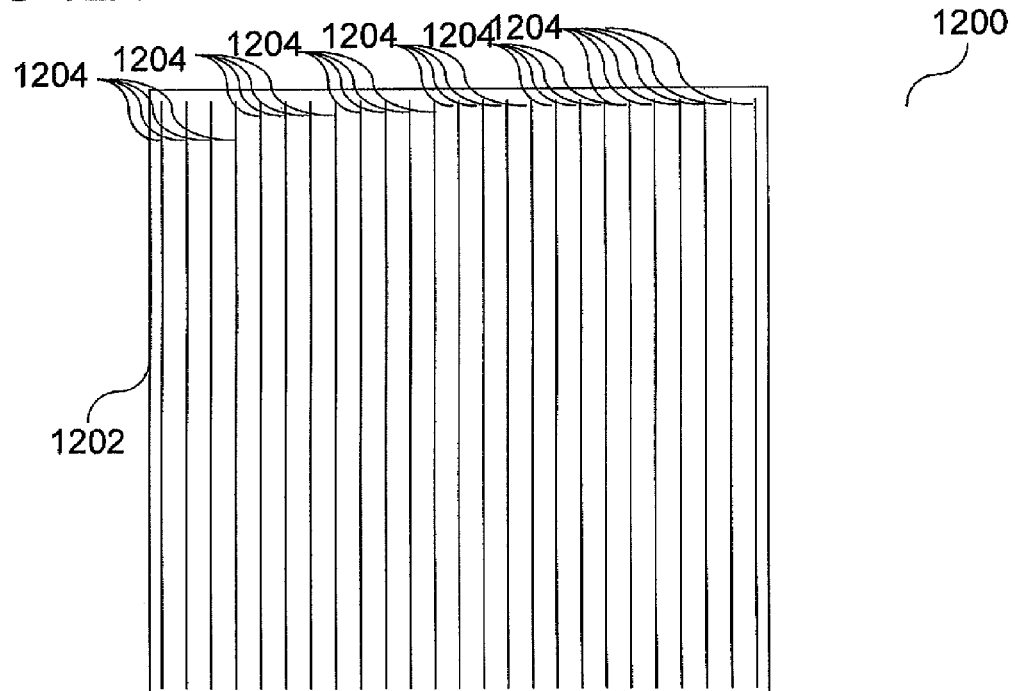
FIG. 12A shows a front view of a photovoltaic cell before the mounting of a photovoltaic cell electrode in accordance with another embodiment.
Figure 12B:
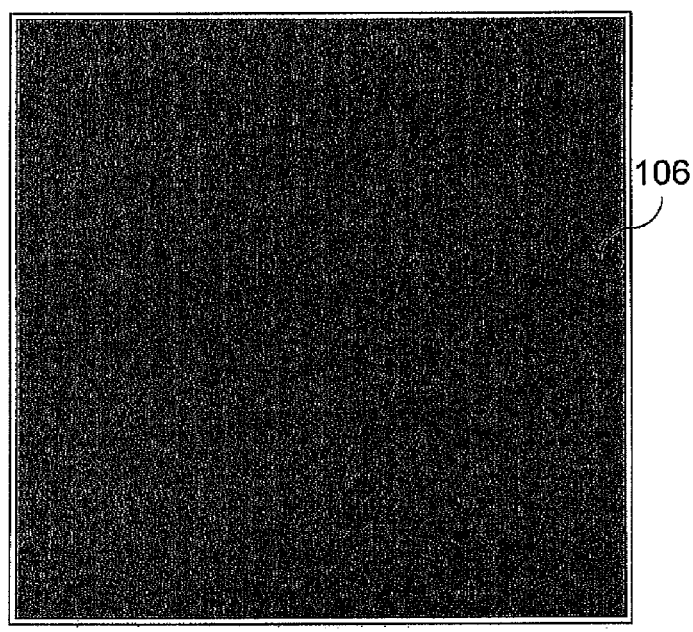
FIG. 12B shows a back view of a photovoltaic cell before the mounting of a photovoltaic cell electrode in accordance with another embodiment.

FIG. 12A shows a front view 1200 of a photovoltaic cell before the mounting of a photovoltaic cell electrode in accordance with another embodiment. FIG. 12B shows a rear view 1210 of a photovoltaic cell before the mounting of a photovoltaic cell electrode in accordance with an embodiment. The above described embodiments described with reference to the photovoltaic cell shown in FIGS. 1A and 1B may also be provided with the photovoltaic cell as shown in FIGS. 12A and 12B.

This embodiment is similar to the embodiment shown in FIGS. 1A and 1B. Therefore, only the differences between these embodiments will be described in more detail below. As shown in FIGS. 12A and 12B, the photovoltaic cell may include an electric contact structure, e.g. implemented in the form of a plurality of metallization lines 1204, which may be provided on or over the front surface (in other words, exposed surface) of the at least one photovoltaic layer 1202 or, if present, on or over the exposed surface of the light-transparent electrically conductive layer. The metallization lines 1204 may extend substantially in parallel to each other at a distance from each other. However, it should be noted that the metallization lines 1204 may alternatively extend with an angle to each other, but they usually do not cross or contact each other along their extensions. In various embodiments, the metallization lines 1204 may be provided in a comb form having a plurality of metal fingers extending in parallel to each other. Compared with the metallization lines 108 in the embodiment shown in FIGS. 1A and 1B, the metallization lines 1204 extend perpendicular with respect to the metallization lines 108 in the embodiment shown in FIGS. 12A and 12B. The rear side 1210 of the photovoltaic cell as shown in FIG. 12B is similar to the rear side 104 of the photovoltaic cell as shown in FIG. 1B.

Figure 13:
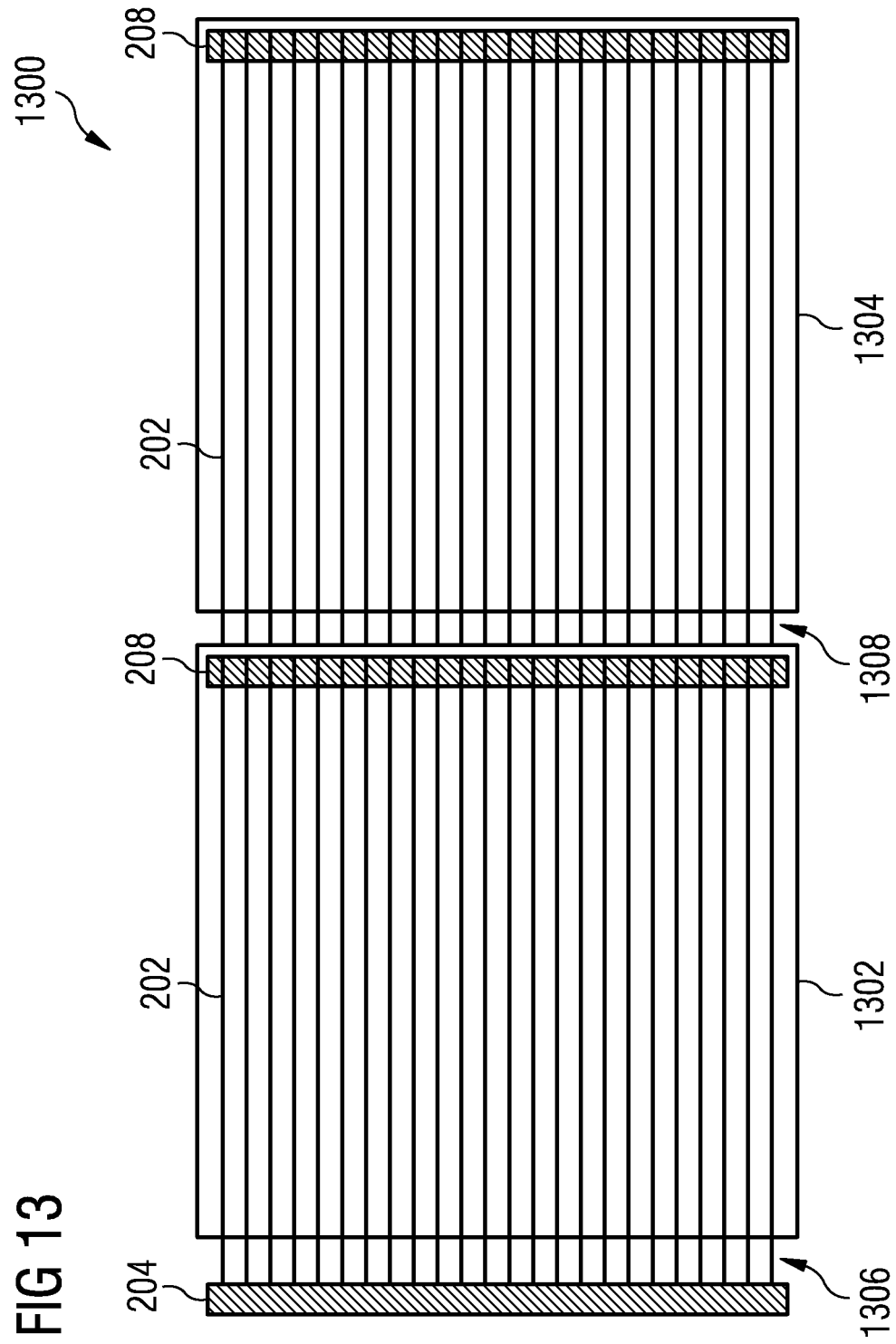
FIG. 13 shows a photovoltaic cell arrangement having two photovoltaic cells, onto which two photovoltaic cell electrodes are arranged in accordance with an embodiment.

FIG. 13 shows a photovoltaic cell arrangement 1300 having two photovoltaic cells 1302, 1304, onto which two photovoltaic cell electrodes 1306, 1308 are arranged in accordance with an embodiment. The photovoltaic cell electrodes 1306, 1308 may be configured similar to the photovoltaic cell electrode 200 as shown in FIG. 2. As shown in FIG. 13, the first photovoltaic cell electrode 1306 is arranged over the first photovoltaic cell 1302, and the second photovoltaic cell electrode 1308 is arranged over the second photovoltaic cell 1304. Furthermore, it is to be noted that the second frame portion 208 (e.g. a second band 208 made of an electrically conductive material, e.g. a second metal band 208) of the first photovoltaic cell electrode 1306 is connected (e.g. soldered) to the front (sun up) surface of the first photovoltaic cell 1302, and the first frame portion 204 (e.g. a first band 204 made of an electrically conductive material, e.g. a first metal band 204) of the second photovoltaic cell electrode 1308 is connected (e.g. soldered) to the rear side of the first photovoltaic cell 1302. Furthermore, the second frame portion 208 (e.g. a second band 208 made of an electrically conductive material, e.g. a second metal band 208) of the second photovoltaic cell electrode 1308 is connected (e.g. soldered) to the front (sun up) surface of the second photovoltaic cell 1304, and so on. In this embodiment, the plurality of electrically conductive wires 202 of the photovoltaic cell electrodes 1306, 1308 are arranged over the metallization lines 108 of the respective photovoltaic cells 1302, 1304, wherein the metallization lines 108 and the plurality of electrically conductive wires 202 have the some orientation (in other words, they are arranged in parallel with each other).

Figure 14:
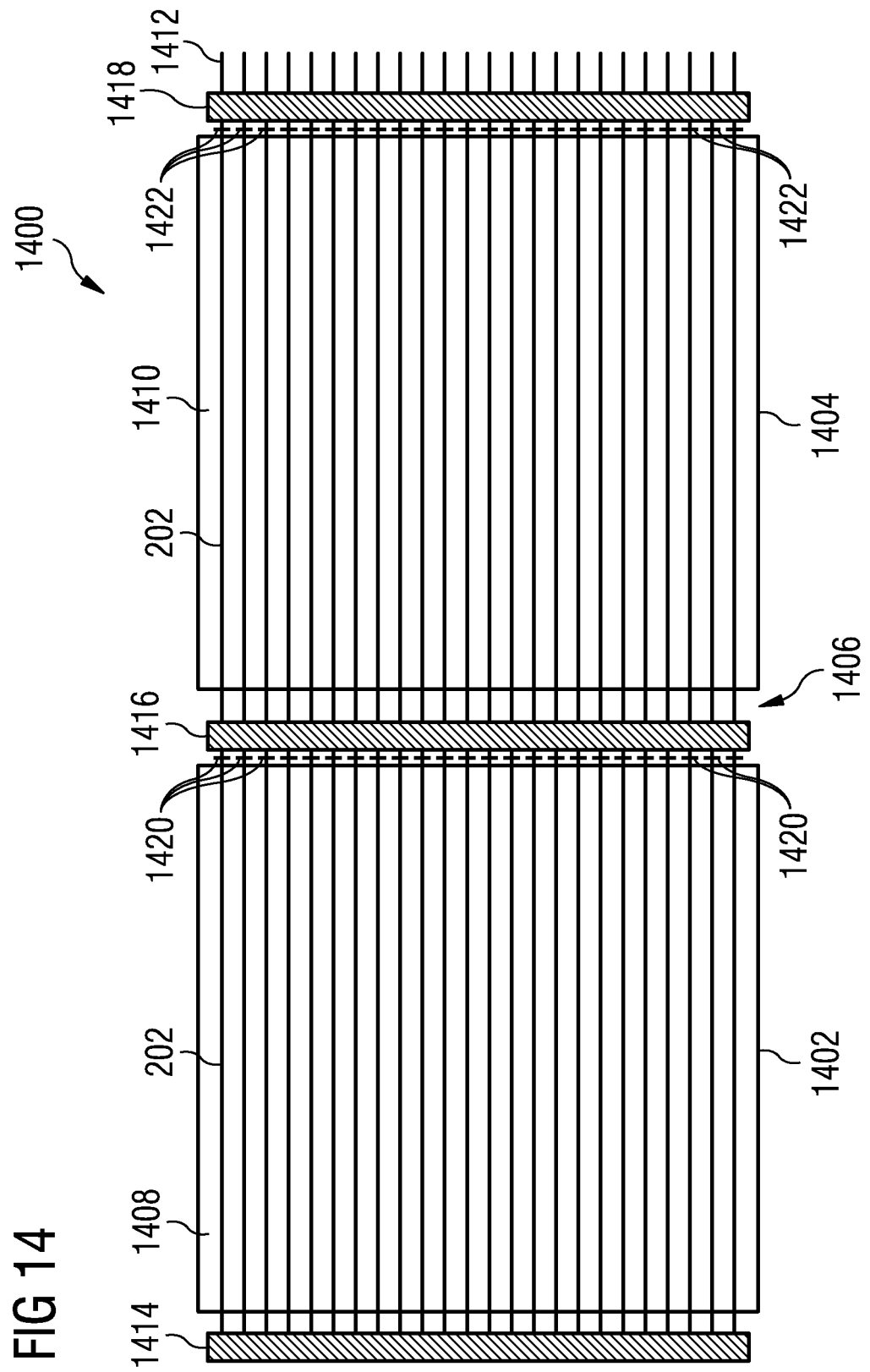
FIG. 14 shows a photovoltaic cell arrangement having two photovoltaic cells, onto which a photovoltaic cell electrode is arranged in accordance with another embodiment.

FIG. 14 shows a photovoltaic cell arrangement 1400 having a plurality of photovoltaic cells 1402, 1404, onto which a photovoltaic cell electrode 1406 having a plurality of photovoltaic cell electrode portions 1408, 1410, 1412, ... , are arranged in accordance with another embodiment. The photovoltaic cell electrode 1406 may be configured similar to the photovoltaic cell electrode 200 as shown in FIG. 2 with the difference that the photovoltaic cell electrode 1406 is one consecutive piece of photovoltaic cell electrode having a plurality or multiplicity (in general an arbitrary number) of photovoltaic cell electrode portions, wherein in predetermined distances, a respective stabilization structure 1414, 1416, 1418 are provided. Each stabilization structure 1414, 1416, 1418 may be implemented as a respective frame portion 1414, 1416, 1418 (e.g. implemented as a respective band 1414, 1416, 1418 made of an electrically conductive material, e.g. a respective metal band 1414, 1416, 1418). As shown in FIG. 14, the photovoltaic cell electrode portions 1408, 1410, 1412 are arranged over the respective photovoltaic cells 1402, 1404, namely the first photovoltaic cell electrode portion 1408 is arranged over the first photovoltaic cell 1402, the second photovoltaic cell electrode portion 1410 is arranged over the second photovoltaic cell 1404, the third photovoltaic cell electrode portion 1412 is arranged over a third photovoltaic cell (not shown), and so on. The electrically conductive wires are then fixed (e.g. soldered) to the lamellar electrically conductive surface regions (e.g. the metallization lines 108). It is to be noted that the frame portions 1414, 1416, 1418 are not fixed to the photovoltaic cells at this stage yet. A method for fixing the photovoltaic cell electrode 1406 in accordance with an embodiment will be described in more detail below. In this embodiment, the plurality of electrically conductive wires 202 of the photovoltaic cell electrode 1406 is arranged over the metallization lines 108 of the respective photovoltaic cells 1402, 1404, wherein the metallization lines 108 and the plurality of electrically conductive wires 202 have the same orientation (in other words, they are arranged in parallel with each other).

Figure 15:
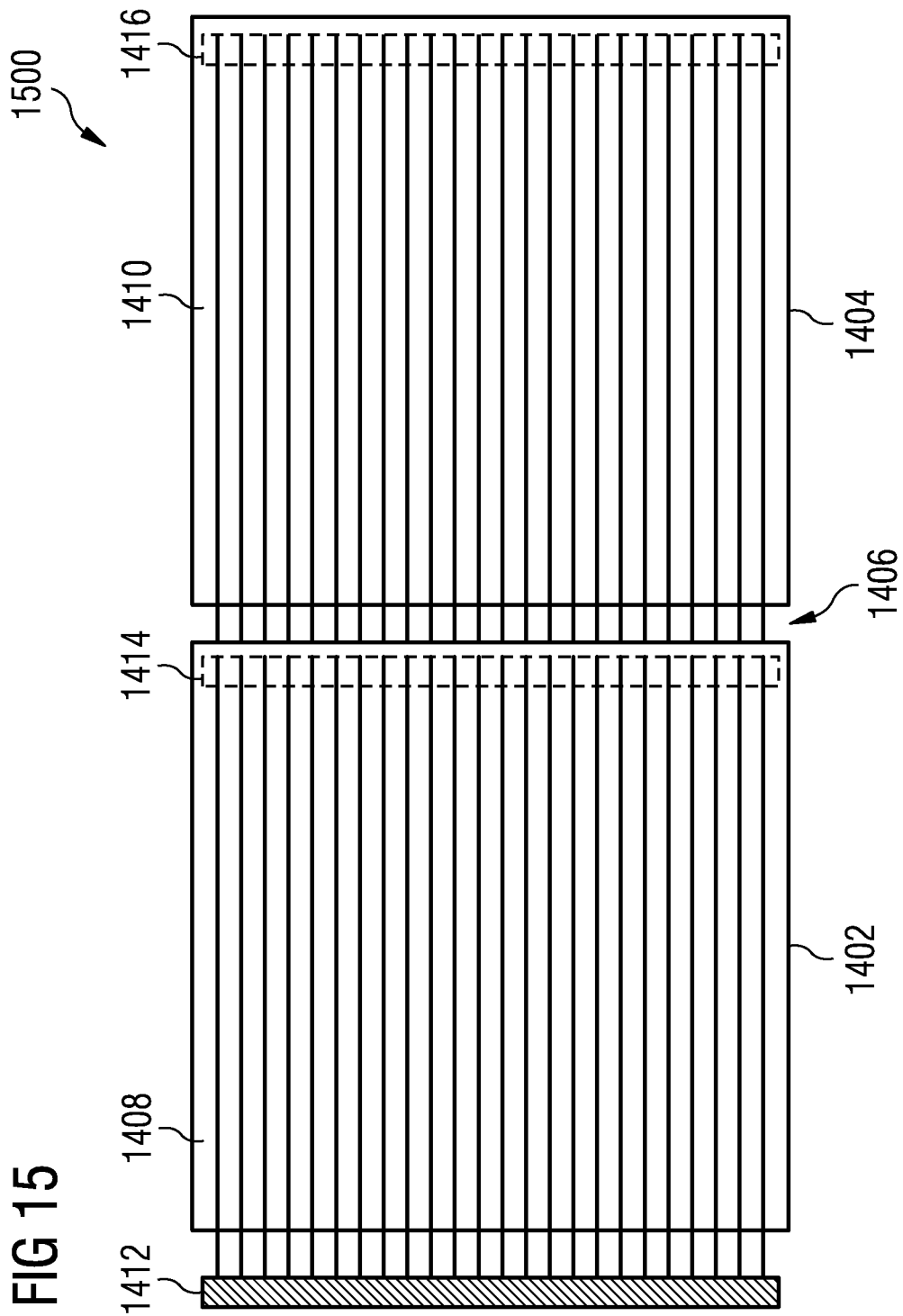
FIG. 15 shows the photovoltaic cell arrangement of FIG. 14 after the separation of a frame portion from a respective photovoltaic cell electrode portion in accordance with an embodiment.

FIG. 15 shows the photovoltaic cell arrangement 1400 of FIG. 14 at a second stage 1500 of manufacture after the separation of a frame portion from a photovoltaic cell electrode portion in accordance with an embodiment (e.g. after the separation of the second frame portion 1416 from the plurality of electrically conductive wires 202 of the first photovoltaic cell electrode portion 1408, wherein the separation, as will be described in more detail below, may be carried out by means of a laser, e.g. at first separation points 1420, and after the separation of the third frame portion 1418 from the plurality of electrically conductive wires 202 of the second photovoltaic cell electrode portion 1408, wherein the separation, as will be described in more detail below, may be carried out by means of a laser, e.g. at second separation points 1422, and so on, as shown in FIG. 14). The separation will be carried out after the fixing (e.g. soldering) of the plurality of electrically conductive wires 202 on the surface of the respective photovoltaic cells 1402, 1404, e.g. after the fixing (e.g. soldering) of the plurality of electrically conductive wires 202 on the metallization lines 108.

As indicated in FIG. 15, the respectively separated frame portion 1416, 1418 will be fixed (e.g. soldered) to the rear side of the "previous" photovoltaic cell 1402, 1404. By way of example, the second frame portion 1416 may be fixed (e.g. soldered) to the rear side of the first photovoltaic cell 1402, and the third frame portion 1418 may be fixed (e.g. soldered) to the rear side of the second photovoltaic cell 1404, and so on.

Figure 16:
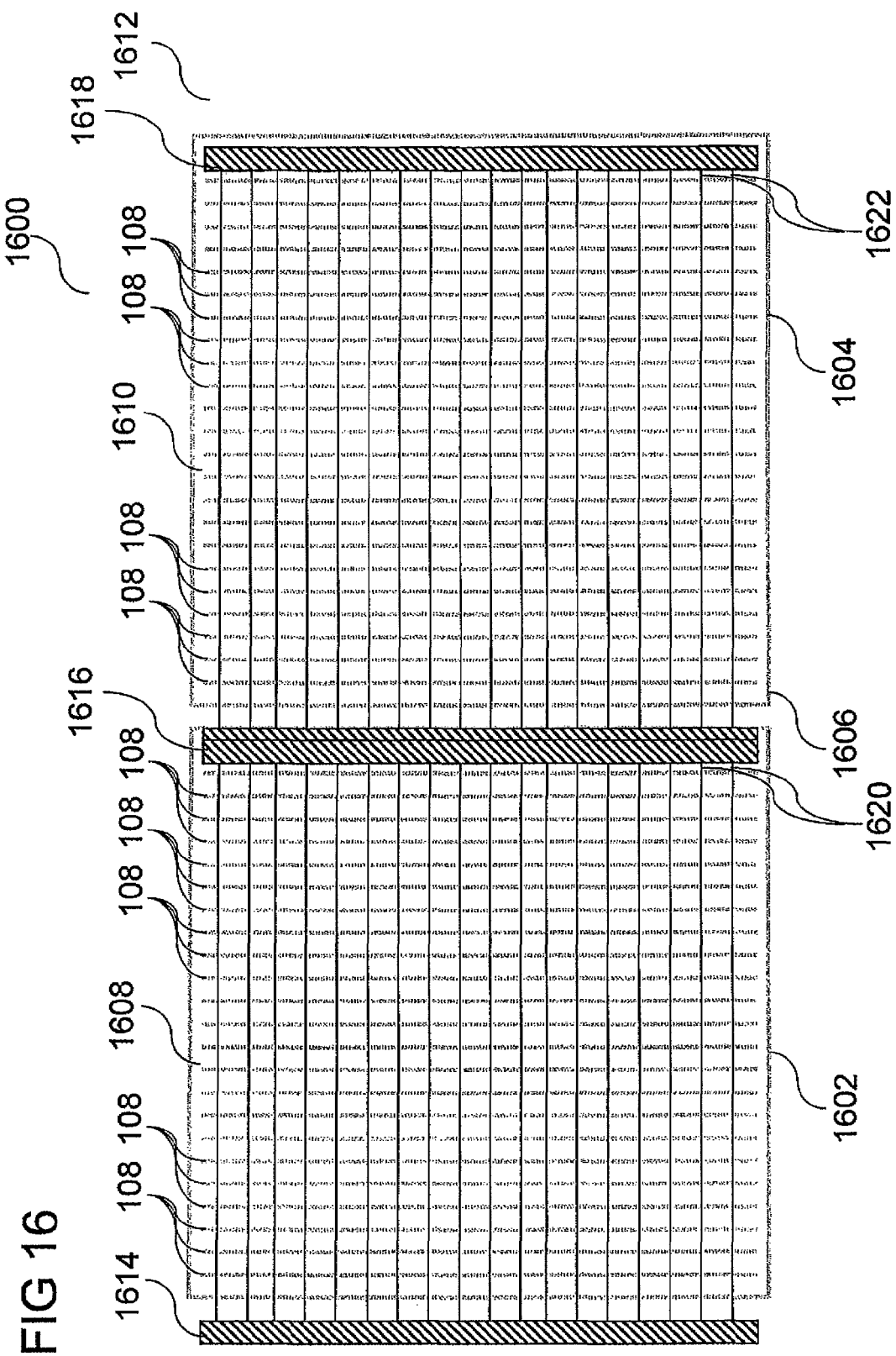
FIG. 16 shows a photovoltaic cell arrangement having two photovoltaic cells, onto which a photovoltaic cell electrode is arranged in accordance with yet another embodiment.

FIG. 16 shows a photovoltaic cell arrangement 1600 having a plurality of photovoltaic cells 1602, 1604, onto which a photovoltaic cell electrode 1606 having a plurality of photovoltaic cell electrode portions 1608, 1610, 1612, . . . , are arranged in accordance with yet another embodiment. The photovoltaic cell electrode 1606 may be configured similar to the photovoltaic cell electrode 200 as shown in FIG. 2 with the difference that the photovoltaic cell electrode 1606 is one consecutive piece of photovoltaic cell electrode having a plurality or multiplicity (in general an arbitrary number) of photovoltaic cell electrode portions, wherein in predetermined distances, a respective stabilization structure 1614, 1616, 1618 are provided. Each stabilization structure 1614, 1616, 1618 may be implemented as a respective frame portion 1614, 1616, 1618 (e.g. implemented as a respective band 1614, 1616, 1618 made of an electrically conductive material, e.g. a respective metal band 1614, 1616, 1618). As shown in FIG. 16, the photovoltaic cell electrode portions 1608, 1610, 1612 are arranged over the respective photovoltaic cells 1602, 1604, namely the first photovoltaic cell electrode portion 1608 is arranged over the first photovoltaic cell 1602, the second photovoltaic cell electrode portion 1610 is arranged over the second photovoltaic cell 1604, the third photovoltaic cell electrode portion 1612 is arranged over a third photovoltaic cell (not shown), and so on. The electrically conductive wires are then fixed (e.g. soldered) to the lamellar electrically conductive surface regions (e.g. the metallization lines 108). It is to be noted that the frame portions 1614, 1616, 1618 are not fixed to the photovoltaic cells at this stage yet. A method for fixing the photovoltaic cell electrode 1606 in accordance with an embodiment will be described in more detail below. In this embodiment, the plurality of electrically conductive wires 202 of the photovoltaic cell electrode 1606 is arranged over the metallization lines 108 of the respective photovoltaic cells 1602, 1604, wherein the metallization lines 108 and the plurality of electrically conductive wires 202 have different orientations (in other words, they are arranged at an angle to each other, e.g. at an angle 0°<α≤90°, at an angle of α=90° (i.e. they are arranged perpendicular to each other). In various embodiments, the plurality of electrically conductive wires of the photovoltaic cell electrode is connected to the plurality of lamellar electrically conductive surface regions aligned above and in parallel with the plurality of lamellar electrically conductive surface regions (i.e. the metallization lines 108 and the plurality of electrically conductive wires 202 may be arranged at an angle of 0° to each other). In various embodiments, the plurality of electrically conductive wires of the photovoltaic cell electrode is connected to the plurality of lamellar electrically conductive surface regions perpendicular to the plurality of lamellar electrically conductive surface regions (i.e. the metallization lines 108 and the plurality of electrically conductive wires 202 may be arranged at an angle of 90° to each other).

Figure 17:
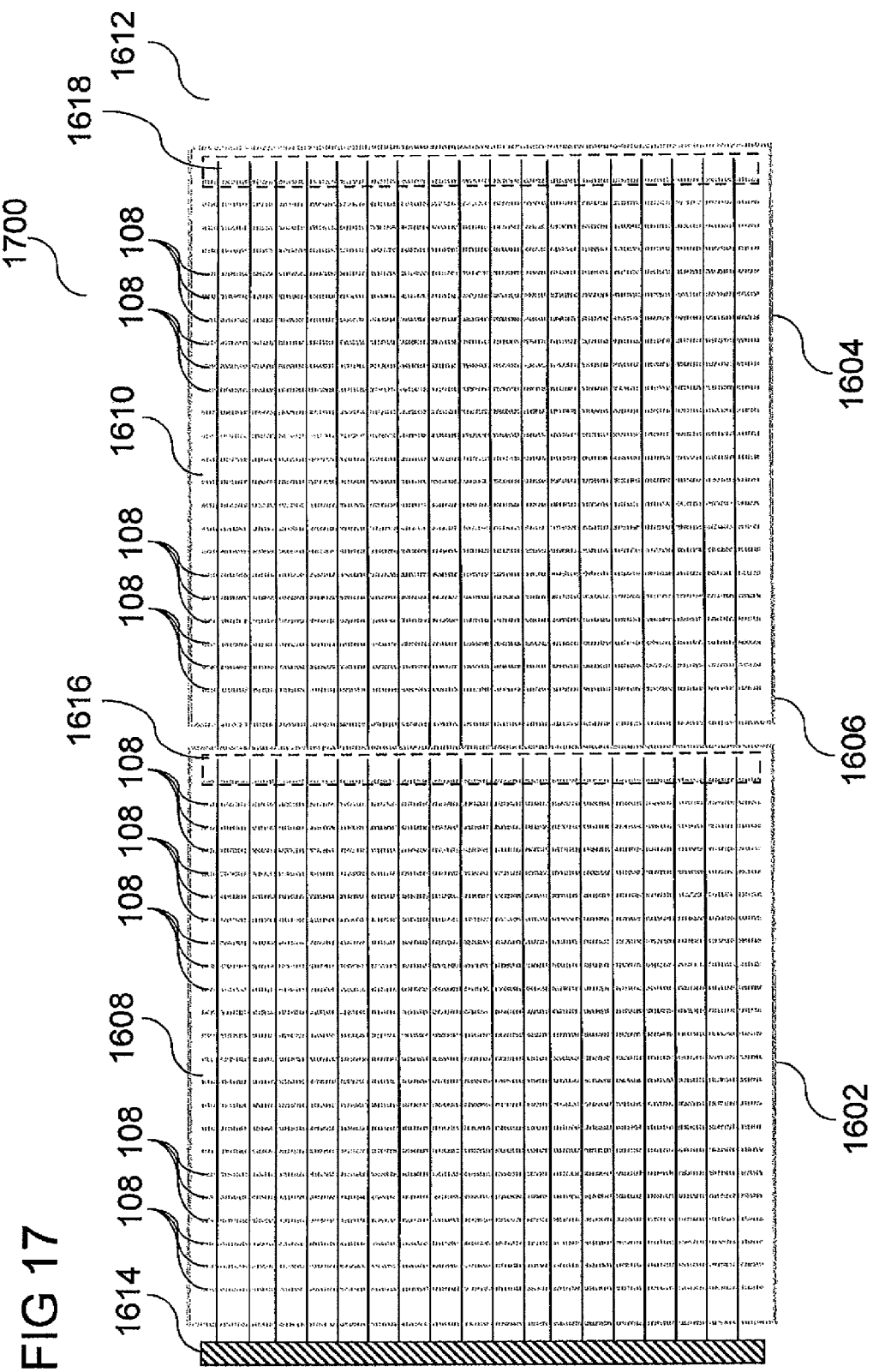
FIG. 17 shows the photovoltaic cell arrangement of FIG. 16 after the separation of a frame portion from a respective photovoltaic cell electrode portion in accordance with an embodiment.

FIG. 17 shows the photovoltaic cell arrangement 1600 of FIG. 16 at a second stage 1700 of manufacture after the separation of a frame portion from a photovoltaic cell electrode portion in accordance with an embodiment (e.g. after the separation of the second frame portion 1616 from the plurality of electrically conductive wires 202 of the first photovoltaic cell electrode portion 1608, wherein the separation, as will be described in more detail below, may be carried out by means of a laser, e.g. at first separation points 1620, and after the separation of the third frame portion 1618 from the plurality of electrically conductive wires 202 of the second photovoltaic cell electrode portion 1608, wherein the separation, as will be described in more detail below, may be carried out by means of a laser, e.g. at second separation points 1622, and so on, as shown in FIG. 16). The separation will be carried out after the fixing (e.g. soldering) of the plurality of electrically conductive wires 202 on the surface of the respective photovoltaic cells 1602, 1604, e.g. after the fixing (e.g. soldering) of the plurality of electrically conductive wires 202 on the metallization lines 108.

As indicated in FIG. 17, the respectively separated frame portion 1616, 1618 will be fixed (e.g. soldered) to the rear side of the "previous" photovoltaic cell 1602, 1604. By way of example, the second frame portion 1616 may be fixed (e.g. soldered) to the rear side of the first photovoltaic cell 1602, and the third frame portion 1618 may be fixed (e.g. soldered) to the rear side of the second photovoltaic cell 1604, and so on.

Figure 18:
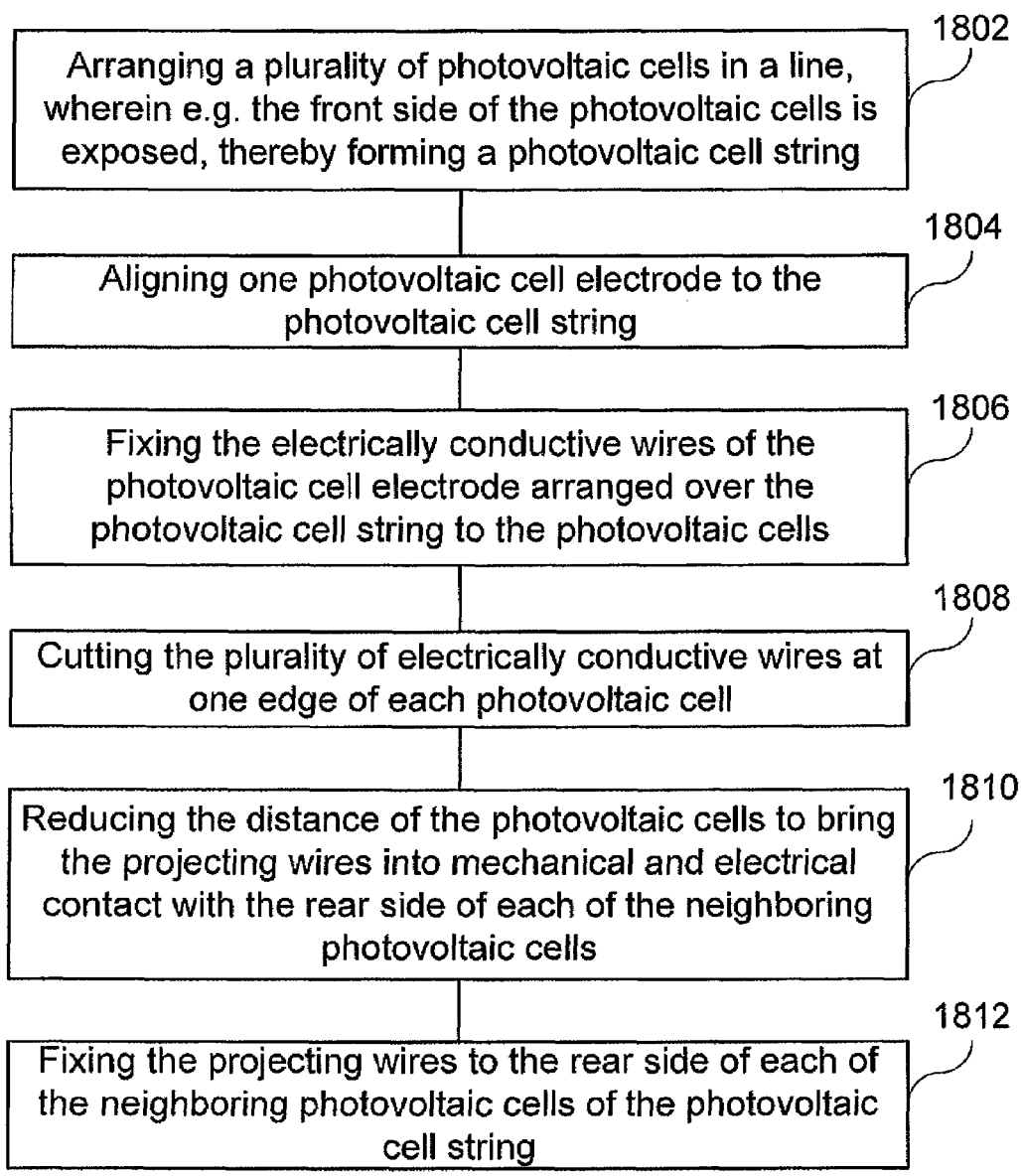
FIG. 18 shows a flow diagram illustrating a method of fixing a photovoltaic cell electrode to a plurality of photovoltaic cells.

FIG. 18 shows a flow diagram 1800 illustrating a method of fixing a photovoltaic cell electrode to a plurality of photovoltaic cells.

At 1802, a plurality of photovoltaic cells (in general an arbitrary number of photovoltaic cells) may arranged in a line, e.g. may be put on a surface, wherein e.g. the sun-up (front) side of the photovoltaic cells is exposed, thereby forming a photovoltaic cell string.

Then, at 1804, one photovoltaic cell electrode is aligned to the photovoltaic cell string. By way of example, a photovoltaic cell electrode (e.g. an "endless" photovoltaic cell electrode such as e.g. the photovoltaic cell electrode 1406 as shown in FIG. 14 or the photovoltaic cell electrode 1606 as shown in FIG. 16) may be drawn from a photovoltaic cell electrode supplier device (e.g. a photovoltaic cell electrode roll, onto which the photovoltaic cell electrode is rolled onto) and the drawn photovoltaic cell electrode may be arranged over the photovoltaic cell string, e.g. in the manner as shown in FIG. 14 or in FIG. 16. In an alternative embodiment, the photovoltaic cell electrode may be a photovoltaic cell electrode string having substantially such a length that it may cover all of the photovoltaic cells of the photovoltaic cell string.

At 1806, the electrically conductive wires of the photovoltaic cell electrode arranged over the photovoltaic cell string may be fixed (e.g. soldered) to the photovoltaic cells, e.g. to the lamellar electrically conductive surface regions, e.g. the metallization lines of the respective photovoltaic cells of the photovoltaic cell string.

Then, at 1808, at one edge of each photovoltaic cell, the plurality of electrically conductive wires (e.g. 202) may be (mechanically) separated, e.g. cut, (e.g. by means of a laser or by any other suitable device) from a respective frame portion. In various embodiments, the frame portions may be kept in the structure, i.e. the frame portions may be coupled to the opposite electrically conductive wires (e.g. 202) and the frame portions may be fixed to the rear side of a respective photovoltaic cell, or, the plurality of electrically conductive wires (e.g. 202) coupled to the other side of the respective frame portion may also be (mechanically) separated, e.g. cut, (e.g. by means of a laser or by any other suitable device) from the respective frame portion. Thus, in this alternative, the frame portions would be removed in the final arrangement and only the free ends of the plurality of electrically conductive wires (e.g. 202) projecting over a respective photovoltaic cell would be fixed to the rear side of a respective neighboring photovoltaic cell.

At 1810, one side of each photovoltaic cell of the photovoltaic cell string may be lifted up at one side and the distance of the photovoltaic cells of the photovoltaic cell string may be reduced to bring the projecting (separated) (ends of the) wires of the plurality of electrically conductive wires (e.g. 202) (and, if present, of spacer structures, e.g. the frame portions, which may optionally be provided, i.e. kept and not removed) into mechanical and electrical contact with the rear side of each of the (e.g. lifted) neighboring photovoltaic cells of the photovoltaic cell string.

Then, at 1812, the projecting (separated) wires of the plurality of electrically conductive wires (e.g. 202) of each of the neighboring photovoltaic cells of the photovoltaic cell string (and, if present, of spacer structures, which may optionally be provided) may be fixed (e.g. soldered) to the rear side of each of the (e.g. lifted) neighboring photovoltaic cells of the photovoltaic cell string.

In various embodiments, an arrangement of a plurality of photovoltaic cells is provided. Each photovoltaic cell may include a plurality of lamellar electrically conductive surface regions. The arrangement may include a plurality of photovoltaic cells with a photovoltaic cell electrode having been electrically connected to the plurality of lamellar electrically conductive surface regions in accordance with a method in accordance with any embodiments as described above. The plurality of electrically conductive wires of the photovoltaic cell electrode may be connected to the plurality of lamellar electrically conductive surface regions at an angle in the range from about 0° to about 90°. In various embodiments, the plurality of electrically conductive wires of the photovoltaic cell electrode may be connected to the plurality of lamellar electrically conductive surface regions at an angle of about 90°.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electrode for electrically connecting a plurality of photovoltaic cells, a first photovoltaic cell comprising a plurality of lamellar electrically conductive surface regions on at least one of a front and back side of the of the first photovoltaic cell, the electrode comprising:
   a plurality of electrically conductive wires extending adjacent to one other; and
   a stabilizing structure coupled to the plurality of electrically conductive wires such that the space between the electrically conductive wires to one another is defined until the plurality of electrically conductive wires has been at least partly fixed on the plurality of lamellar electrically conductive surface regions of a photovoltaic cell,
   wherein the stabilizing structure comprises a frame structure coupled to each of the plurality of electrically conductive wires,
   wherein the frame structure comprises a first frame portion comprising a first band of electrically conductive material coupled to a first end region of each of the plurality of electrically conductive wires and a second frame portion comprising a second band of electrically conductive material coupled to a second end region of each of the plurality of electrically conductive wires,
   wherein the first frame portion of electrically conductive material is provided on the back side of the first photovoltaic cell and the second frame portion of electrically conductive material is provided on the front side of a second photovoltaic cell, and
   wherein the second frame portion has a smaller width than the first frame portion.

2. The electrode as claimed in claim 1, wherein the plurality of electrically conductive wires extend in parallel to one another.

3. The electrode as claimed in claim 1, wherein the plurality of electrically conductive wires comprises at least twenty electrically conductive wires.

4. The electrode as claimed in claim 1, wherein some or all electrically conductive wires of the plurality of electrically conductive wires have a wire width of 0.5 mm or less.

5. The electrode as claimed in claim 1, wherein the cross-section of the plurality of electrically conductive wires has a form selected from a group consisting of: a round form, an oval form, a triangle form, a rectangular form, a square form, and a polygonal form.

6. The electrode as claimed in claim 1, wherein at least one of the first frame portion and the second frame portion comprises a ribbon or a wire meshwork.

7. The electrode as claimed in claim 1, wherein at least one of the first frame portion and the second frame portion extend perpendicular to the plurality of electrically conductive wires.

8. The electrode as claimed in claim 1, wherein the stabilizing structure comprises a sheet structure carrying the plurality of electrically conductive wires, wherein the sheet structure is coupled to the plurality of electrically conductive wires such that it can be at least partially removed from the plurality of electrically conductive wires after the plurality of electrically conductive wires has been at least partly fixed on the lamellar conductive regions of the photovoltaic cell.

9. The electrode as claimed in claim 8, wherein the sheet structure comprises a first portion coupled to a first side of the plurality of electrically conductive wires and a second portion coupled to a second side of the plurality of electrically conductive wires, the second side being opposite to the first side with respect to the plurality of electrically conductive wires.

10. An arrangement of a plurality of photovoltaic cells, a first photovoltaic cell comprising a plurality of lamellar electrically conductive surface regions on at least one of a front and back side of the of the first photovoltaic cell, the arrangement comprising: a plurality of photovoltaic cells with a photovoltaic cell electrode having been electrically connected to the plurality of lamellar electrically conductive surface regions in accordance with a method for electrically connecting a photovoltaic cell, the method comprising:
bringing an electrode into contact with the photovoltaic cell, the electrode comprising: a plurality of electrically conductive wires extending adjacent to one other; and a stabilizing structure coupled to the plurality of electrically conductive wires such that the space between the electrically conductive wires to one another is defined until the plurality of electrically conductive wires has been at least partly fixed on the plurality of lamellar electrically conductive surface regions of a photovoltaic cell; and
fixing the plurality of electrically conductive wires of the electrode to a surface of the photovoltaic cell,
wherein the stabilizing structure comprises a frame structure coupled to each of the plurality of electrically conductive wires,
wherein the frame structure comprises a first frame portion comprising a first band of electrically conductive material coupled to a first end region of each of the plurality of electrically conductive wires and a second frame portion comprising a second band of electrically conductive material coupled to a second end region of each of the plurality of electrically conductive wires,
wherein the first frame portion of electrically conductive material is provided on the back side of the first photovoltaic cell and the second frame portion of electrically conductive material is provided on the front side of a second photovoltaic cell, and
wherein the second frame portion has a smaller width than the first frame portion.

11. The arrangement as claimed in claim 10, wherein the plurality of electrically conductive wires of the photovoltaic cell electrode is connected to the plurality of lamellar electrically conductive surface regions aligned above and in parallel with the plurality of lamellar electrically conductive surface regions; or wherein the plurality of electrically conductive wires of the photovoltaic cell electrode is connected to the plurality of lamellar electrically conductive surface regions perpendicular to the plurality of lamellar electrically conductive surface regions.

12. An electrode for electrically connecting a plurality of photovoltaic cells, a first photovoltaic cell comprising a plurality of lamellar electrically conductive surface regions on at least one of a front and back side of the of the first photovoltaic cell, the electrode comprising:
a plurality of electrically conductive wires extending adjacent to one other; and
a stabilizing structure coupled to the plurality of electrically conductive wires such that the space between the electrically conductive wires to one another is defined until the plurality of electrically conductive wires has been at least partly fixed on the plurality of lamellar electrically conductive surface regions of a photovoltaic cell,
wherein the stabilizing structure comprises a frame structure coupled to each of the plurality of electrically conductive wires,
wherein the frame structure comprises a first frame portion comprising a first band of electrically conductive material coupled to a first end region of each of the plurality of electrically conductive wires and a second frame portion comprising a second band of electrically conductive material coupled to a second end region of each of the plurality of electrically conductive wires,
wherein the first frame portion of electrically conductive material is provided on the back side of the first photovoltaic cell and the second frame portion of electrically conductive material has a smaller width than the first frame portion.

13. An arrangement of a plurality of photovoltaic cells, a first photovoltaic cell comprising a plurality of lamellar electrically conductive surface regions on at least one of a front and back side of the of the first photovoltaic cell, the arrangement comprising: a plurality of photovoltaic cells with a photovoltaic cell electrode having been electrically connected to the plurality of lamellar electrically conductive surface regions in accordance with a method for electrically connecting a photovoltaic cell, the method comprising:
bringing an electrode into contact with the photovoltaic cell, the electrode comprising
a plurality of electrically conductive wires extending adjacent to one other; and
a stabilizing structure coupled to the plurality of electrically conductive wires such that the space between the electrically conductive wires to one another is defined until the plurality of electrically conductive wires has been at least partly fixed on the plurality of lamellar electrically conductive surface regions of a photovoltaic cell; and
fixing the plurality of electrically conductive wires of the electrode to a surface of the photovoltaic cell,
wherein the stabilizing structure comprises a frame structure coupled to each of the plurality of electrically conductive wires,
wherein the frame structure comprises a first frame portion comprising a first band of electrically conductive material coupled to a first end region of each of the plurality of electrically conductive wires and a second frame portion comprising a second band of electrically conductive material coupled to a second end region of each of the plurality of electrically conductive wires,
wherein the first frame portion of electrically conductive material is provided on the back side of the first photovoltaic cell and the plurality of electrically conductive wires is provided on the front side of a second photovoltaic cell.

* * * * *